(12) United States Patent  
Nakagawa et al.

(10) Patent No.: US 9,761,281 B2
(45) Date of Patent: Sep. 12, 2017

(54) SEMICONDUCTOR DEVICE

(71) Applicant: Semiconductor Energy Laboratory Co., Ltd., Atsugi-shi, Kanagawa-ken (JP)

(72) Inventors: Takashi Nakagawa, Kanagawa (JP); Takayuki Ikeda, Kanagawa (JP); Yoshiyuki Kurokawa, Kanagawa (JP); Munehiro Kozuma, Kanagawa (JP); Takeshi Aoki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/602,950

(22) Filed: Jan. 22, 2015

(65) Prior Publication Data

US 2015/0213846 A1    Jul. 30, 2015

(30) Foreign Application Priority Data

Jan. 24, 2014  (JP) ................................ 2014-010993
Sep. 4, 2014   (JP) ................................ 2014-179884

(51) Int. Cl.
  *G11C 11/24*   (2006.01)
  *G11C 5/14*    (2006.01)
  *G11C 14/00*   (2006.01)

(52) U.S. Cl.
  CPC .............. *G11C 5/148* (2013.01); *G11C 11/24* (2013.01); *G11C 14/0054* (2013.01)

(58) Field of Classification Search
  CPC ................................ G11C 5/148; G11C 11/24

USPC ........................................................... 365/72
See application file for complete search history.

(56) References Cited

U.S. PATENT DOCUMENTS

| 7,550,994 | B1 | 6/2009 | Camarota et al. |
| 7,944,765 | B1 | 5/2011 | Han et al. |
| 8,410,838 | B2 | 4/2013 | Kato et al. |
| 8,675,382 | B2 | 3/2014 | Kurokawa |
| 8,850,108 | B1 | 9/2014 | Hayes et al. |
| 8,860,485 | B2 | 10/2014 | Kato et al. |
| 9,065,438 | B2 | 6/2015 | Aoki et al. |
| 9,350,334 | B2 | 5/2016 | Kato et al. |

(Continued)

FOREIGN PATENT DOCUMENTS

JP         2013-034040 A        2/2013

*Primary Examiner* — Hoai V Ho
*Assistant Examiner* — Muna A Techane
(74) *Attorney, Agent, or Firm* — Fish & Richardson P.C.

(57) ABSTRACT

To provide a semiconductor device having a novel configuration, in which a malfunction and power consumption are reduced. A data holding circuit which includes a flipflop including first and second latch circuits and a shadow register including a nonvolatile memory portion; and a control signal generation circuit which generates a first control signal supplied to the first latch circuit and a second control signal supplied to the second latch circuit are included. The shadow register is a circuit which controls data saving or data restoring between the first and second latch circuits on the basis of a saving control signal or a restore control signal. The control signal generation circuit is a circuit which generates the first and second control signals at L level in a period during which data is saved or restored, on the basis of a clock signal, the saving control signal, and the restore control signal.

13 Claims, 25 Drawing Sheets

(56) References Cited

U.S. PATENT DOCUMENTS

| | | | |
|---|---|---|---|
| 2004/0066669 A1* | 4/2004 | Ooishi | G11C 14/0081 365/173 |
| 2012/0033510 A1* | 2/2012 | Nagatsuka | G11C 11/403 365/189.15 |
| 2012/0250407 A1* | 10/2012 | Kurokawa | H01L 27/0688 365/182 |
| 2013/0207170 A1 | 8/2013 | Kurokawa | |
| 2013/0285697 A1 | 10/2013 | Kurokawa | |
| 2013/0286757 A1 | 10/2013 | Takemura | |
| 2013/0314124 A1 | 11/2013 | Ikeda et al. | |
| 2013/0321025 A1 | 12/2013 | Kurokawa et al. | |
| 2014/0126271 A1 | 5/2014 | Aoki et al. | |
| 2014/0269013 A1 | 9/2014 | Tsutsui et al. | |
| 2014/0286076 A1* | 9/2014 | Aoki | G11C 5/06 365/72 |
| 2014/0368235 A1 | 12/2014 | Aoki et al. | |
| 2016/0226471 A1 | 8/2016 | Kato et al. | |

\* cited by examiner

FIG. 23

SEMICONDUCTOR DEVICE

BACKGROUND OF THE INVENTION

1. Field of the Invention

One embodiment of the present invention relates to a semiconductor device.

Note that one embodiment of the present invention is not limited to the above technical field. The technical field of the invention disclosed in this specification and the like relates to an object, a method, or a manufacturing method. In addition, the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

In recent years, a data holding circuit in which data can be saved and restored by a combination of a flipflop circuit including a volatile memory portion (hereinafter, abbreviated as FF circuit in some cases) and a nonvolatile shadow register circuit (hereinafter, abbreviated as SR circuit in some cases) has been developed (e.g., see Patent Document 1).

The data holding circuit has a function of saving data from an FF circuit to an SR circuit when power supply is stopped and restoring data from the SR circuit to the FF circuit when the power supply is restarted so that the data is held even when the power supply is stopped. By the data saving and the data restoring, data before power supply stop is not lost even after the power supply is restarted, and the interrupted arithmetic processing can be restarted.

REFERENCE

Patent Document

[Patent Document 1] Japanese Published Patent Application No. 2013-34040

SUMMARY OF THE INVENTION

In the case where power gating is performed in an FF circuit to reduce power consumption, data in the FF circuit is lost. Therefore, it is necessary that data in the FF circuit is saved (backed up) to a nonvolatile SR circuit and the data is restored (recovered) after the power supply is restarted.

In the case where the data saving operation and the data restoring operation are performed when the FF circuit is in operation, a problem arises in the data saving or the data restoring. Here, a two-phase clock FF circuit including a first latch circuit (also referred to as a master latch) and a second latch circuit (also referred to as a slave latch) is described.

Specifically, in the case where a control signal (a signal corresponding to one of two phases of the clock) supplied to each of the first latch circuit and the second latch circuit is changed during the data saving or the data restoring, the first latch circuit or the second latch circuit in the FF circuit fetches new data different from data which is to be saved (or restored).

An object of one embodiment of the present invention is to provide a semiconductor device or the like having a novel structure in which the above malfunction can be reduced. Another object of one embodiment of the present invention is to provide a low-power semiconductor device or the like having a novel structure. Another object of one embodiment of the present invention is to provide a novel semiconductor device or the like.

Note that the objects of embodiments of the present invention are not limited to the above. The above objects do not disturb the existence of other objects. The other objects are objects that are not described above and will be described below. The other objects will be apparent from and can be derived as appropriate from the description of the specification, the drawings, and the like by those skilled in the art. One embodiment of the present invention achieves at least one of the above objects and/or the other objects.

One embodiment of the present invention is a semiconductor device including a first circuit and a second circuit. The first circuit includes a third circuit and a fourth circuit. The third circuit includes a fifth circuit and a sixth circuit. The fourth circuit includes a circuit functioning as a nonvolatile memory portion. The second circuit has a function of outputting a third signal and a fourth signal on the basis of a clock signal, a first signal, and a second signal. The fifth circuit and the sixth circuit have a function of latching data. The third signal has a function of controlling the fifth circuit. The fourth signal has a function of controlling the sixth circuit. The fourth circuit has a function of saving data from the fifth circuit and the sixth circuit to the fourth circuit on the basis of the first signal in a first period and a function of restoring the data from the fourth circuit to the fifth circuit and the sixth circuit on the basis of the second signal in a second period. The third signal and the fourth signal have the same logic level in the first period and the second period.

Note that other embodiments of the present invention will be described in the following embodiments with reference to the drawings.

According to one embodiment of the present invention, it is possible to provide a semiconductor device or the like having a novel structure in which a malfunction can be reduced. According to one embodiment of the present invention, it is possible to provide a low-power semiconductor device or the like having a novel structure. According to one embodiment of the present invention, it is possible to provide a novel semiconductor device or the like.

Note that the effects of embodiments of the present invention are not limited to the above effects. The above effects do not disturb the existence of other effects. The other effects are effects that are not described above and will be described below. The other effects will be apparent from and can be derived as appropriate from the description of the specification, the drawings, and the like by those skilled in the art. One embodiment of the present invention achieves at least one of the above effects and/or the other effects. Accordingly, one embodiment of the present invention does not have the above effects in some cases.

BRIEF DESCRIPTION OF THE DRAWINGS

In the accompanying drawings:

FIG. 23 is a block diagram for describing a configuration in Example;

DETAILED DESCRIPTION OF THE INVENTION

Figure 1A:
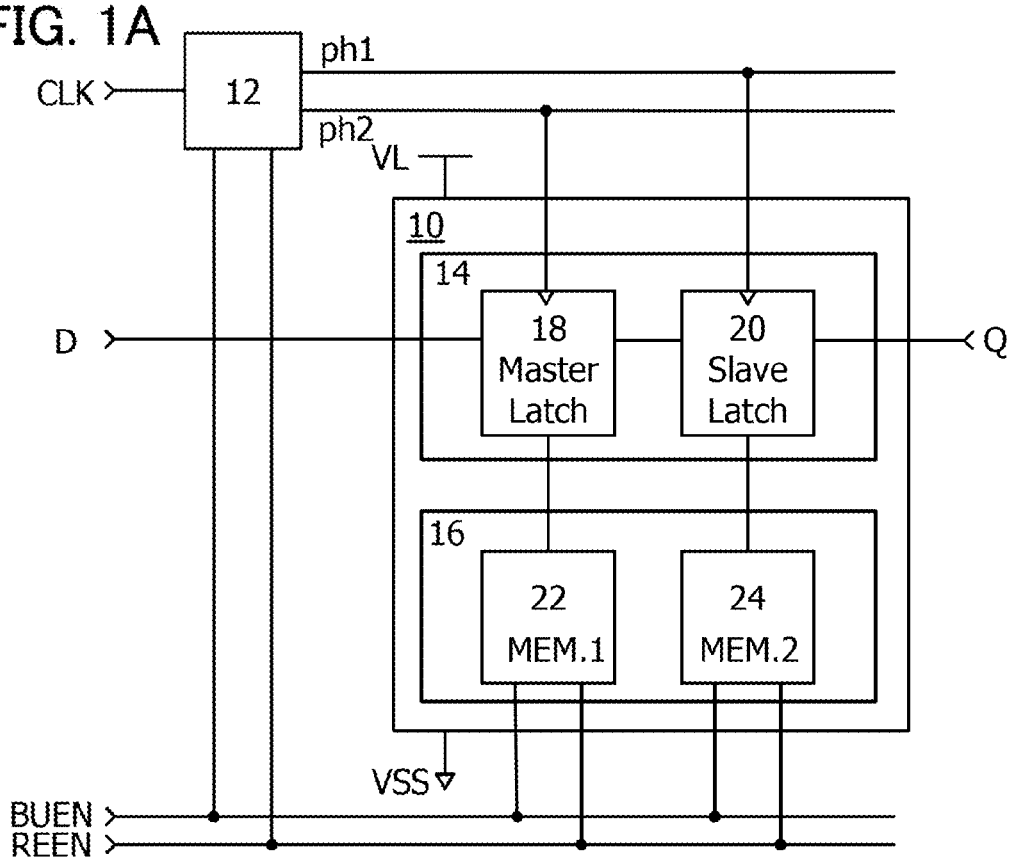
FIGS. 1A and 1B are a circuit block diagram and a timing chart for describing one embodiment of the present invention.

Embodiments will be hereinafter described with reference to drawings. Note that embodiments can be carried out in many different modes, and it is easily understood by those skilled in the art that modes and details of the present invention can be modified in various ways without departing from the spirit and the scope of the present invention. Therefore, the present invention should not be interpreted as being limited to the description in the following embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion which functions as the source and a portion which functions as the drain are not called a source and a drain, and one of the source and the drain is referred to as a first electrode and the other thereof is referred to as a second electrode in some cases.

Note that ordinal numbers such as "first", "second", and "third" in this specification are used in order to avoid confusion among components, and the terms do not limit the components numerically.

Note that in this specification, the phrase "A and B are connected" or "A is connected to B" means the case where A and B are electrically connected to each other as well as the case where A and B are directly connected to each other. Here, the phrase "A and B are electrically connected" or "A is electrically connected to B" means the following case: when an object having any electrical function exists between A and B, an electric signal can be transmitted and received between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and Z2 denotes an object (e.g., a device, an element, a circuit, a wiring, an electrode, a terminal, a conductive film, a layer, or the like).

Note that in this specification, terms for describing arrangement, such as "over" and "under", are used for convenience for describing the positional relationship between components with reference to drawings. Furthermore, the positional relationship between components is changed as appropriate in accordance with a direction in which each component is described. Thus, the positional relationship is not limited to that described with a term used in this specification and can be explained with another term as appropriate depending on the situation.

Note that the positional relationships of circuit blocks in block diagrams are specified for description, and even in the case where different circuit blocks have different functions in the diagrams, the different circuit blocks might be provided in an actual circuit block so that different functions are achieved in the same circuit block. The functions of circuit blocks in diagrams are specified for description, and even in the case where one circuit block is illustrated, blocks might be provided in an actual circuit block so that processing performed by one circuit block is performed by a plurality of circuit blocks.

Embodiment 1

In a circuit block diagram in FIG. 1A, a data holding circuit 10 which functions as a semiconductor device of one embodiment of the present invention and a control signal generation circuit 12 which generates a signal for controlling the data holding circuit 10 are shown.

The data holding circuit 10 in FIG. 1A is a sequential circuit including an FF circuit 14 (volatile flipflop circuit) including a volatile memory portion and a nonvolatile SR circuit 16 (shadow register circuit). The data holding circuit 10 is supplied with power supply voltage by power supply lines VL and VSS. Power gating is performed in the data holding circuit 10 by switching the potential of the power supply line. Data held in the FF circuit 14 when power supply voltage is supplied to the data holding circuit 10 is saved to the SR circuit 16 before the supply of power supply voltage is stopped. The saved data is restored from the SR circuit 16 to the FF circuit 14 after the supply of power supply voltage is restarted. The data holding circuit 10 is referred to as a memory circuit or simply referred to as a circuit in some cases since the data holding circuit 10 is a circuit for holding data.

The control signal generation circuit 12 in FIG. 1A is supplied with a clock signal CLK, a save control signal BUEN, and a restore control signal REEN and outputs control signals ph1 and ph2. The control signal ph2 is a signal for controlling transferring or holding of data in a first latch circuit 18. The control signal ph1 is a signal for controlling transferring or holding of data in a second latch circuit 20.

In the case where a plurality of data holding circuits 10 is provided, the control signal generation circuit 12 may be provided for each of the plurality of data holding circuits 10. Such a configuration can suppress delay of the control signals ph1 and ph2 input to the data holding circuit 10. The control signal generation circuit 12 may have a configuration to obtain the control signals ph1 and ph2 through a combination circuit on the basis of a single-phase clock signal.

Figure 12:
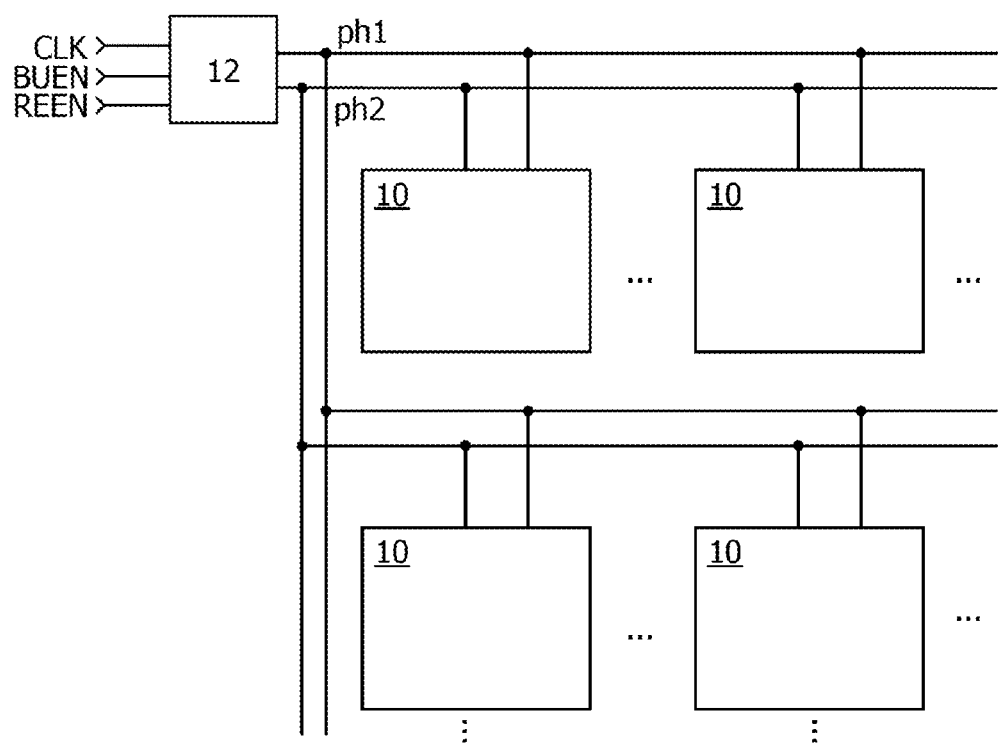
FIG. 12 is a circuit block diagram for describing one embodiment of the present invention.

One control signal generation circuit 12 may be provided for a plurality of data holding circuits 10 as illustrated in FIG. 12. Such a configuration can decrease the number of control signal generation circuits 12 and reduce the size of the semiconductor device.

The FF circuit 14 in FIG. 1A includes the first latch circuit 18 and the second latch circuit 20. The FF circuit 14 is supplied with data from a data terminal D connected to the first latch circuit 18. The FF circuit 14 outputs data from an output terminal Q connected to the second latch circuit 20.

The data is transferred from the data terminal D to the first latch circuit 18 when the control signal ph2 is at H level, and the data is held in the first latch circuit 18 when the control signal ph2 is at L level. The data is transferred from the first latch circuit 18 to the second latch circuit 20 when the control signal ph1 is at H level, and the data is held in the second latch circuit 20 when the control signal ph1 is at L level.

The control signal ph1 and the control signal ph2 correspond to a clock signal and an inverted clock signal, and have an advantage that data racing is less likely to occur because they have a period during which both the signals are at L level. The control signal ph1 and the control signal ph2 are referred to as a two-phase clock and in particular, a two-phase clock having a period during which both the signals are at L level is referred to as a two-phase non-overlap clock in some cases.

The FF circuit 14 is a sequential circuit for holding or outputting data in response to the control signals ph1 and ph2 in a state where power supply voltage is supplied. Since the FF circuit 14 is a circuit which holds data, the FF circuit 14 is referred to as a memory circuit or simply referred to as a circuit in some cases. The FF circuit 14 can be formed using a combination circuit, e.g., an analog switch for transferring data, an inverter circuit forming a latch circuit, and the like.

In a configuration including the first latch circuit 18 and the second latch circuit 20, data can be transferred and held alternately; thus, a malfunction due to data racing in the FF circuit 14 can be prevented. An inverter loop for holding data is formed in each of the first latch circuit 18 and the second latch circuit 20. Potentials corresponding to data supplied from the data terminal D can be held in nodes in the latch circuits.

The SR circuit 16 in FIG. 1A includes a nonvolatile memory circuit 22 and a nonvolatile memory circuit 24.

The SR circuit 16 is a circuit capable of holding data in a period during which the supply of power supply voltage is stopped. Since the SR circuit 16 is a circuit for holding data, the SR circuit 16 is referred to as a memory circuit or simply referred to as a circuit in some cases. The SR circuit 16 includes a nonvolatile memory element.

As the nonvolatile memory element, a flash memory, a ferroelectric random access memory (FeRAM), a magnetoresistive random access memory (MRAM), a phase change random access memory (PRAM), a resistance random access memory (ReRAM), or the like can be used. Alternatively, a circuit which holds data by holding charge and which utilizes an extremely low off-state current of a transistor including an oxide semiconductor layer may be used as the nonvolatile memory element. By forming a nonvolatile memory element using a transistor including an oxide semiconductor layer, the transistor and a transistor including a silicon layer can be stacked.

Note that in a memory circuit that utilizes an extremely low off-state current of a transistor including an oxide semiconductor layer in a channel portion, a predetermined voltage might keep being supplied to the transistor in a period for holding data. For example, a voltage that turns off the transistor completely may keep being supplied to a gate of the transistor. Alternatively, a voltage that shifts the threshold voltage of the transistor to make the transistor in a normally-off state may keep being supplied to a back gate of the transistor. In these cases, the voltage is supplied to the memory circuit in the period for holding data. However, because almost no current flows, little power is consumed. Because of little power consumption, even if the predetermined voltage is supplied to the memory circuit, the memory circuit can be regarded as being substantially nonvolatile.

Data to be held in the SR circuit 16 is transferred from the first latch circuit 18 to the nonvolatile memory circuit 22 and from the second latch circuit 20 to the nonvolatile memory circuit 24, by controlling the save control signal BUEN. Furthermore, data held in the SR circuit 16 is transferred from the nonvolatile memory circuit 22 to the first latch circuit 18 and from the nonvolatile memory circuit 24 to the second latch circuit 20, by controlling the restore control signal REEN.

Note that the nonvolatile memory circuit 22 and the nonvolatile memory circuit 24 may be referred to as a first nonvolatile memory circuit and a second nonvolatile memory circuit, respectively.

The nonvolatile memory circuit 22 is connected to a latch included in the first latch circuit 18 and holds data held in the first latch circuit 18 in a period during which the supply of power supply voltage is stopped. The nonvolatile memory circuit 24 is connected to a latch included in the second latch circuit 20 and holds data held in the second latch circuit 20 in a period during which the supply of power supply voltage is stopped. Data saving between the first latch circuit 18 and the nonvolatile memory circuit 22 and between the second latch circuit 20 and the nonvolatile memory circuit 24 is controlled by the save control signal BUEN, and data restoring therebetween is controlled by the restore control signal REEN.

The save control signal BUEN is a signal for saving data from the first latch circuit 18 and the second latch circuit 20 to the nonvolatile memory circuit 22 and the nonvolatile memory circuit 24 at H level and holding data at L level. The restore control signal REEN is a signal for restoring data from the nonvolatile memory circuit 22 and the nonvolatile memory circuit 24 to the first latch circuit 18 and the second latch circuit 20 at H level and stopping the data restoration at L level. The save control signal BUEN is simply referred to as a control signal or a signal in some cases. The restore control signal REEN is simply referred to as a control signal or a signal in some cases.

The power supply lines VL and VSS are power supply lines for controlling power gating of the data holding circuit 10. The power supply lines VL and VSS can control power gating of the data holding circuit 10 in such a manner that the supply of power supply voltage is stopped or restarted by switching a potential to be supplied. For example, in the case where the supply of power supply voltage is stopped, the potential of the power supply line VL is set to VSS, which is a potential equal to VSS of the power supply line VSS. In the case where the supply of power supply voltage is restarted, the potential of the power supply line VL is set to VDD and the potential of the power supply line VSS is set to VSS. Although the description is made assuming that the potential of the power supply line VSS is VSS, the potential may be a ground potential.

According to one embodiment of the present invention, a data holding circuit which includes an FF circuit including a volatile memory portion having a first latch circuit and a second latch circuit and an SR circuit including a nonvolatile memory portion and a control signal generation circuit which generates a first control signal supplied to the first latch circuit and a second control signal supplied to the second latch circuit are provided. The SR circuit is a circuit in which data saving from or data restoring to the first latch circuit and the second latch circuit is controlled on the basis of the save control signal or the restore control signal. The control signal generation circuit is a circuit for generating a first control signal and a second control signal at L level in a period during which data is saved or restored, on the basis of the clock signal, the save control signal, and the restore control signal.

This configuration enables the data holding circuit to save data from the FF circuit to the SR circuit when power supply is stopped, and restore the data from the SR circuit to the FF circuit when the power supply is restarted; thus, data can be held even when the power supply is stopped. Through such data saving and data restoring, data before the power supply stop is not lost even after the power supply is restarted, and interrupted arithmetic processing can be restarted. Thus, intermittent power gating of the data holding circuit can be performed, so that power consumption can be reduced.

In the case where the above data saving and data restoring are applied to an FF circuit including a first latch circuit and a second latch circuit, a malfunction due to data racing needs to be prevented, and according to one embodiment of the present invention, a control signal generation circuit generates a first control signal and a second control signal at L level in a period during which data is saved or restored, on the basis of a clock signal, a save control signal, and a restore control signal. Therefore, the following malfunction can be reduced: in the case where control signals supplied to the first latch circuit and the second latch circuit are changed during data saving or data restoring, the first latch circuit or the second latch circuit in the FF circuit fetches new data different from one to be saved (or restored).

Figure 1B:
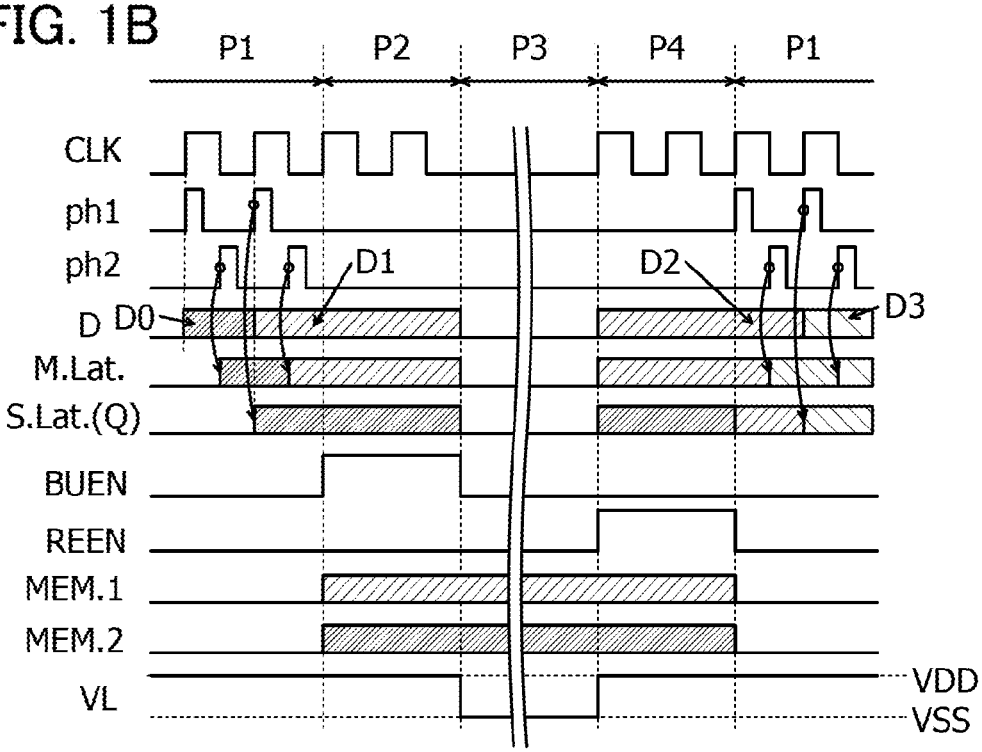

Next, operation of the data holding circuit 10 and the control signal generation circuit 12 shown in the circuit block diagram in FIG. 1A is described. FIG. 1B is a schematic timing chart of input/output signals in the circuit block in FIG. 1A in normal operation, data saving, power supply stop, and data restoring.

In FIG. 1B, a normal operation period, a data saving period, a power supply stop period, and a data restoring period are referred to as P1, P2, P3, and P4, respectively. Furthermore, FIG. 1B shows change of the clock signal CLK, the control signal ph1, the control signal ph2, data of the data terminal D, data held in the first latch circuit (M.Lat.), data held in the second latch circuit (S.Lat.), the save control signal BUEN, the restore control signal REEN, data held in the nonvolatile memory circuit 22 (MEM.1), data held in the nonvolatile memory circuit 24 (MEM.2), and a potential of the power supply line VL which are shown in FIG. 1A in each of the periods.

As data held in the first latch circuit 18 and the second latch circuit 20, data D0 to D3 is shown in FIG. 1B. Data D0 to D3 is binary data of "1" and "0", and data "1" is held as an H-level potential and data "0" is held as an L-level potential. The first latch circuit 18 and the second latch circuit 20 each include an inverter loop. The inverter loop holds an H-level potential or an L-level potential at two nodes. The H-level or L-level potential at each node is held in the nonvolatile memory circuit 22 and the nonvolatile memory circuit 24.

Data is transferred to and held in the first latch circuit 18 and the second latch circuit 20 when the control signal ph1 and the control signal ph2 are at H level. In the nonvolatile memory circuit 22 and the nonvolatile memory circuit 24, as described above, data is saved from the first latch circuit 18 and the second latch circuit 20 when the save control signal BUEN is at H level and data is held when the save control signal BUEN is at L level. In the nonvolatile memory circuit 22 and the nonvolatile memory circuit 24, data is restored to the first latch circuit 18 and the second latch circuit 20 when the restore control signal REEN is at H level and the data restoration is stopped when the restore control signal REEN is at L level. The potential of the power supply line VL is VDD in normal operation, data saving, and data restoring, and is VSS in power supply stop.

In the normal operation (period P1 in FIG. 1B), the clock signal CLK, and the save control signal BUEN and the restore control signal REEN at L level are supplied to the control signal generation circuit 12. Accordingly, the control signal ph1 and the control signal ph2 are generated and data D0 and D1 of the data terminal D are transferred to and held in the inverter loop included in each of the first latch circuit 18 and the second latch circuit 20.

Next, in the data saving (period P2 in FIG. 1B), the clock signal CLK is input to the control signal generation circuit 12 and the save control signal BUEN becomes H level. In this case, the control signal generation circuit 12 outputs the control signal ph1 and the control signal ph2 for stopping toggle operation. The data D0 and D1 held in the first latch circuit 18 and the second latch circuit 20 are saved to the nonvolatile memory circuit 22 and the nonvolatile memory circuit 24.

Next, in the power supply stop (period P3 in FIG. 1B), the power supply line VL is set to VSS so that the supply of power supply voltage is stopped. Thus, the clock signal CLK, the save control signal BUEN, and the restore control signal REEN are set to L level. By stopping the supply of power supply voltage, the data held in the inverter loop included in each of the first latch circuit 18 and the second latch circuit 20 is lost; however, the data saved to the nonvolatile memory circuit 22 and the nonvolatile memory circuit 24 in the data saving is held.

Next, in the data restoring (period P4 in FIG. 1B), the clock signal CLK is input to the control signal generation circuit 12 and the restore control signal REEN is at H level. In this case, the control signal generation circuit 12 outputs the control signal ph1 and the control signal ph2 for stopping toggle operation. The data D0 and D1 held in the nonvolatile memory circuit 22 and the nonvolatile memory circuit 24 are restored to the first latch circuit 18 and the second latch circuit 20.

In another normal operation (period P1 in FIG. 1B), the clock signal CLK, and the save control signal BUEN and the restore control signal REEN at L level are supplied to the control signal generation circuit 12. Accordingly, the control signal ph1 and the control signal ph2 are generated and data D2 and D3 of the data terminal D are transferred to and held in the inverter loop included in each of the first latch circuit 18 and the second latch circuit 20.

According to one embodiment of the present invention, as shown in FIG. 1B, the control signal generation circuit outputs the control signal ph1 and the control signal ph2 at L level in the data saving and the data restoring. The data holding circuit having the above configuration can reduce a malfunction in which, when data is saved or restored between the first and second latch circuits 18 and 20 and the nonvolatile memory circuits 22 and 24 in the power supply stop, the first latch circuit or the second latch circuit fetches new data different from one to be saved (or restored).

Next, a specific configuration of the control signal generation circuit 12 to output the control signal ph1 and the control signal ph2 at L level in the data saving and the data restoring is described.

Figure 2A:
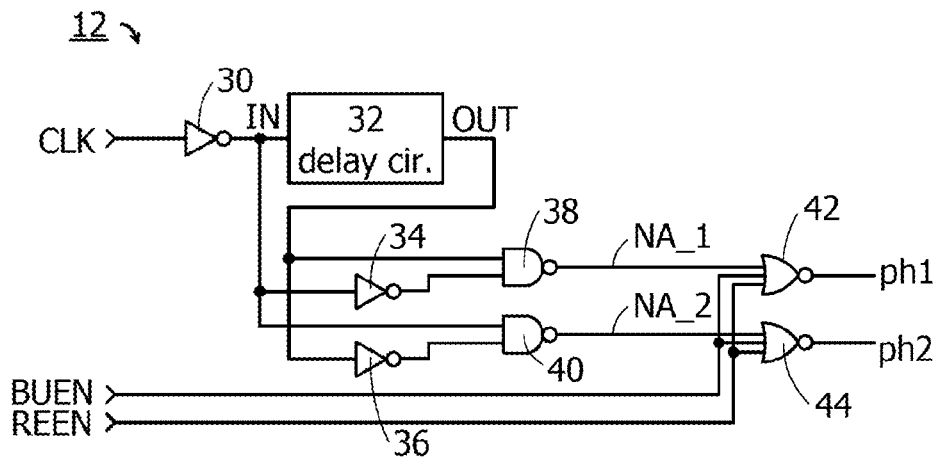
FIGS. 2A to 2C are circuit diagrams and a timing chart for describing one embodiment of the present invention.
Figure 14:
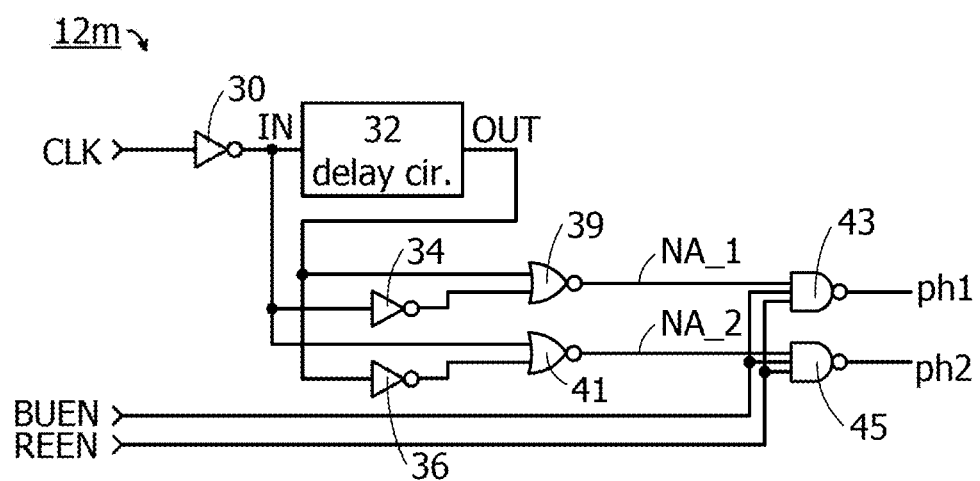
FIG. 14 is a circuit diagram for describing one embodiment of the present invention.

FIG. 2A shows an example of a circuit configuration of the control signal generation circuit 12. The control signal generation circuit 12 includes an inverter circuit 30, a delay circuit 32 (denoted by "delay cir." in diagrams), inverter circuits 34 and 36, NAND circuits 38 and 40, and NOR circuits 42 and 44. Note that combination circuits such as a NAND circuit and a NOR circuit can be replaced with combination circuits capable of outputting the same logic level signals; for example, as in FIG. 14, the NAND circuits 38 and 40 can be replaced with NOR circuits 39 and 41 and the NOR circuits 42 and 44 can be replaced with NAND circuits 43 and 45.

Figure 2B:
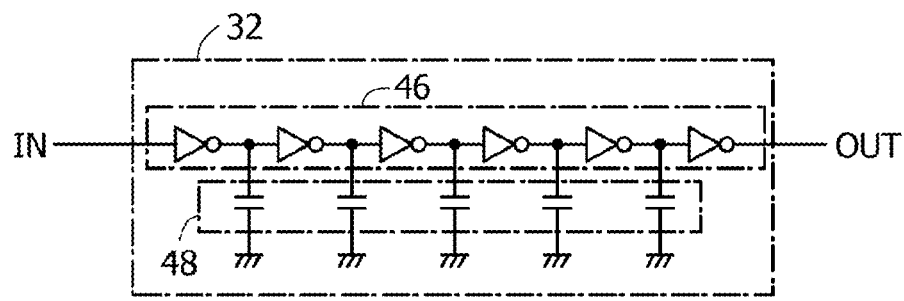

FIG. 2B shows an example of a circuit functioning as the delay circuit 32. The delay circuit 32 includes a plurality of inverter circuits 46 and a plurality of capacitors 48. The capacitors 48 are not necessarily provided because they are provided to increase delay of a signal in the plurality of inverter circuits 46.

When the clock signal CLK is input to the inverter circuit 30, an inverted clock signal is generated. The inverted clock signal is input to an input portion IN of the delay circuit 32 so that a delayed and inverted clock signal is generated in an output portion OUT of the delay circuit 32. The signal of the input portion IN through the inverter circuit 34 and the signal of the output portion OUT are input to the NAND circuit 38, and a signal at a node NA_1 is obtained. The signal of the output portion OUT through the inverter circuit 36 and the signal of the input portion IN are input to the NAND circuit 40, and a signal at a node NA_2 is obtained. The signal at the node NA_1, the save control signal BUEN, and the restore control signal REEN are input to the NOR circuit 42, and the control signal ph1 is obtained. The signal at the node NA_2, the save control signal BUEN, and the restore control signal REEN are input to the NOR circuit 44, and the control signal ph2 is obtained.

Figure 2C:
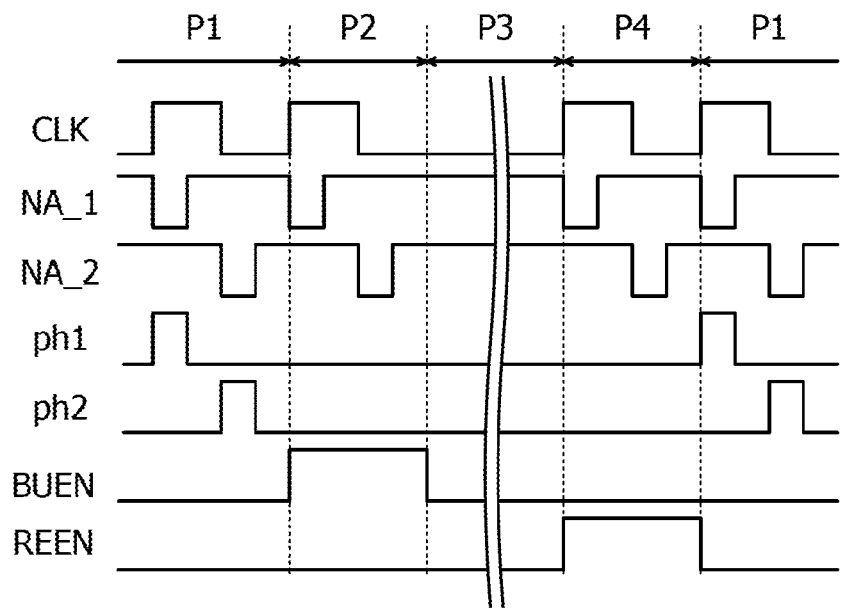

FIG. 2C is a timing chart of signals obtained in the control signal generation circuit 12 in FIG. 2A. FIG. 2C, like FIG. 1B, is a schematic timing chart of signals in FIG. 2A in P1 to P4.

According to one embodiment of the present invention, as shown in FIG. 2C, the control signal generation circuit can output the control signal ph1 and the control signal ph2 at L level in the data saving and the data restoring. The data holding circuit having the above configuration can reduce a malfunction in which, when data is saved or restored between the first and second latch circuits 18 and 20 and the nonvolatile memory circuits 22 and 24 in the power supply stop, the first latch circuit or the second latch circuit fetches new data different from one to be saved (or restored).

Next, a specific configuration of the data holding circuit 10 in which data is held in the FF circuit 14 in a period during which power supply voltage is supplied and in which data can be held in the SR circuit 16 in a period during which the supply of power supply voltage is stopped is described with reference to FIG. 3.

Figure 15:
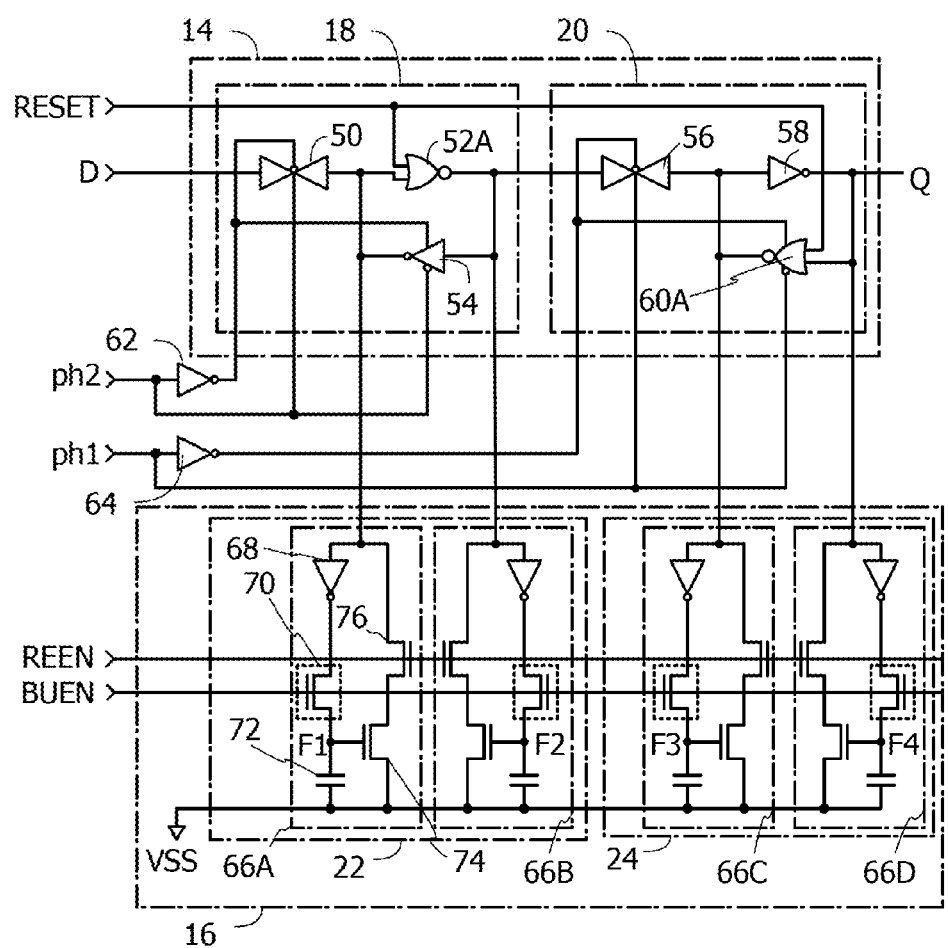
FIG. 15 is a circuit diagram for describing one embodiment of the present invention.

The FF circuit 14 includes the first latch circuit 18 and the second latch circuit 20. The first latch circuit 18 includes an analog switch 50, a NAND circuit 52, and an inverter circuit 54. The second latch circuit 20 includes an analog switch 56, an inverter circuit 58, and a NAND circuit 60. Combination circuits such as a NAND circuit and a NOR circuit can be replaced with combination circuits capable of outputting the same logic signals; for example, as in the data holding circuit 10m shown in FIG. 15, the NAND circuits 52 and 60 can be replaced with NOR circuits 52A and 60A.

The control signal ph2 and the control signal ph2 inverted through the inverter circuit 62 are control signals for turning on the analog switch 50 and the inverter circuit 54 alternately. The control signal ph1 and the control signal ph1 inverted through the inverter circuit 64 are control signals for turning on the analog switch 50 and the inverter circuit 54 alternately.

Specifically, when the control signal ph2 is at H level, the analog switch 50 is turned on, and data of the data terminal D is supplied to a first input terminal of the NAND circuit 52, so that output of the inverter circuit 54 becomes high impedance. When the control signal ph2 is at L level, the analog switch 50 is turned off, and both of the NAND circuit 52 and the inverter circuit 54 function as inverter circuits; thus, data supplied to the first input terminal of the NAND circuit 52 is held.

When the control signal ph1 is at H level, the analog switch 56 is turned on, and output data of the NAND circuit 52 is supplied to a first input terminal of the NAND circuit 60 through the inverter circuit 58, so that output of the NAND circuit 60 becomes high impedance. When the control signal ph1 is at L level, the analog switch 56 is turned off, and both of the NAND circuit 60 and the inverter circuit 58 function as inverter circuits; thus, data supplied to the first input terminal of the NAND circuit 60.

A reset signal RESET is input to second input terminals of the NAND circuits 52 and 60. When the reset signal RESET is at H level, the NAND circuits 52 and 60 function as inverter circuits, and when the reset signal RESET is at L level, signals of output terminal become H level.

The SR circuit 16 includes the nonvolatile memory circuits 22 and 24. In FIG. 3, a circuit using a transistor including an oxide semiconductor layer is used as a nonvolatile memory element in each of the nonvolatile memory circuits 22 and 24. Since the transistor including an oxide semiconductor layer has an extremely low off-state current, charge can be held, and with the use of such charge, the circuit can be used as a circuit which holds data.

The nonvolatile memory circuit 22 includes memory circuits 66A and 66B connected to two nodes included in an inverter loop in the first latch circuit 18. Furthermore, the nonvolatile memory circuit 24 includes memory circuits 66C and 66D connected to two nodes included in an inverter loop in the second latch circuit 20. The memory circuits 66A, 66B, 66C, and 66D have the same circuit configuration, and a circuit configuration of the memory circuit 66A is described in detail.

The memory circuit 66A includes an inverter circuit 68, a transistor 70, a capacitor 72, a transistor 74, and a transistor 76. The memory circuit 66A includes a node F1 capable of holding a potential corresponding to data "1" or "0" at least in a period during which the supply of power supply voltage is stopped. The memory circuits 66B, 66C, and 66D include nodes F2 to F4 as nodes corresponding to the node F1 of the memory circuit 66A. Although the transistors 74 and 76 included in the memory circuit 66A are n-channel transistors here, p-channel transistors can be used as the transistors 74 and 76 by inverting the logic level of the save control signal BUEN and the restore control signal REEN.

The node F1 holds a potential of one of the two nodes included in the inverter loop in the first latch circuit 18 at least in a period during which the supply of power supply voltage is stopped. The node F2 holds a potential of the other of the two nodes included in the inverter loop in the first latch circuit 18 at least in the period during which the supply of power supply voltage is stopped. The node F3 holds a potential of one of the two nodes included in the inverter loop in the second latch circuit 20 at least in a period during which the supply of power supply voltage is stopped. The node F4 holds a potential of the other of the two nodes included in the inverter loop in the second latch circuit 20 at least in the period during which the supply of power supply voltage is stopped.

An input terminal of the inverter circuit 68 is connected to the one of the two nodes included in the inverter loop in the first latch circuit 18. An output terminal of the inverter circuit 68 is connected to one of a source and a drain of the transistor 70.

A gate of the transistor 70 is connected to a wiring which supplies the save control signal BUEN. The other of the source and the drain of the transistor 70 is connected to a gate of the transistor 74 and one electrode of the capacitor 72. A node where the other of the source and the drain of the transistor 70, the gate of the transistor 74, and the one electrode of the capacitor 72 are connected to each other is referred to as the node F1. Although the other electrode of the capacitor 72 is connected to a power supply line which supplies VSS, the potential may be another potential (e.g., GND). When the transistor 74 has high parasitic capacitance such as gate capacitance, the capacitor 72 can be eliminated.

One of a source and a drain of the transistor 74 is connected to the power supply line which supplies VSS, and the other of the source and the drain of the transistor 74 is connected to one of a source and a drain of the transistor 76.

A gate of the transistor 76 is connected to a wiring which supplies the restore control signal REEN. The other of the source and the drain of the transistor 76 is connected to the one of the two nodes included in the inverter loop in the first latch circuit 18.

When the save control signal BUEN is switched from L level to H level, the transistor 70 is turned on; thus, data obtained by inverting data of the first latch circuit 18 can be transferred to the node F1. By setting the save control signal BUEN at L level, the transistor 70 is turned off, so that charge of the node F1 is held. A potential corresponding to the charge corresponds to a potential of the data obtained by inverting the data of the first latch circuit 18. Therefore, at the node F1, the data of the first latch circuit 18 can be held.

When the restore control signal REEN is switched from L level to H level, the transistor 76 is turned on. The on/off state of the transistor 74 is determined by a potential of the node F1, that is, a potential of the data obtained by inverting the data of the first latch circuit 18. For example, when the data of the first latch circuit 18 is at H level, the potential of the node F1 becomes L level; thus, the transistor 74 is turned off (put in a high resistance state). When the data of the first latch circuit 18 is at L level, the potential of the node F1 becomes H level; thus, the transistor 74 is turned on (put in a low resistance state).

The memory circuit 66A to/from which data of the first latch circuit 18 is saved or restored is described above, and the same operation is performed in the memory circuit 66B to/from which data of the first latch circuit 18 is saved or restored. The node F2 in the memory circuit 66B holds data having different logic level from that at the node F1. For example, when the potential of the node F1 is at H level, the potential of the node F2 becomes L level; thus, the transistor 74 in the memory circuit 66B is turned off (put in a high resistance state). On the other hand, when the potential of the node F1 is at L level, the potential of the node F2 becomes H level; thus, the transistor 74 in the memory circuit 66B is turned on (put in a low resistance state).

The memory circuits 66C and 66D to/from which data of the second latch circuit 20 is saved or restored have the same circuit configuration as the memory circuits 66A and 66B. The node F3 of the memory circuit 66C holds data having different logic level from that at the node F4 of the memory circuit 66D. In other words, when a potential of one of the nodes F3 and F4 is at H level, a potential of the other of the nodes F3 and F4 is at L level, and the transistor 74 in one of the memory circuits 66C and 66D is turned on (put in a low resistance state) and the transistor 74 in the other of the memory circuits 66C and 66D is turned off (put in a high resistance state).

The on/off state (low/high resistance state) of the transistor 74 in each memory circuit which depends on the potentials of the nodes F1 to F4 is determined by the memory circuit 66A, the memory circuit 66B, or a combination of the memory circuits 66A and 66B. Therefore, when the transistor 76 is turned on and the supply of power supply voltage to the inverter loop is restarted, a potential difference occurs at the two nodes included in the inverter loop in the first latch circuit 18. By using the potential difference, the potential of the inverter loop in the first latch circuit 18 is set to a potential of original data. Similarly, by switching the restore control signal REEN from L level to H level, H level held in the node F3 or F4 holding data of the second latch circuit 20 sets a potential of one of the two nodes included in the inverter loop in the second latch circuit 20 to a potential of original data. Therefore, data can be restored to the first latch circuit 18 and the second latch circuit 20.

Figure 3:
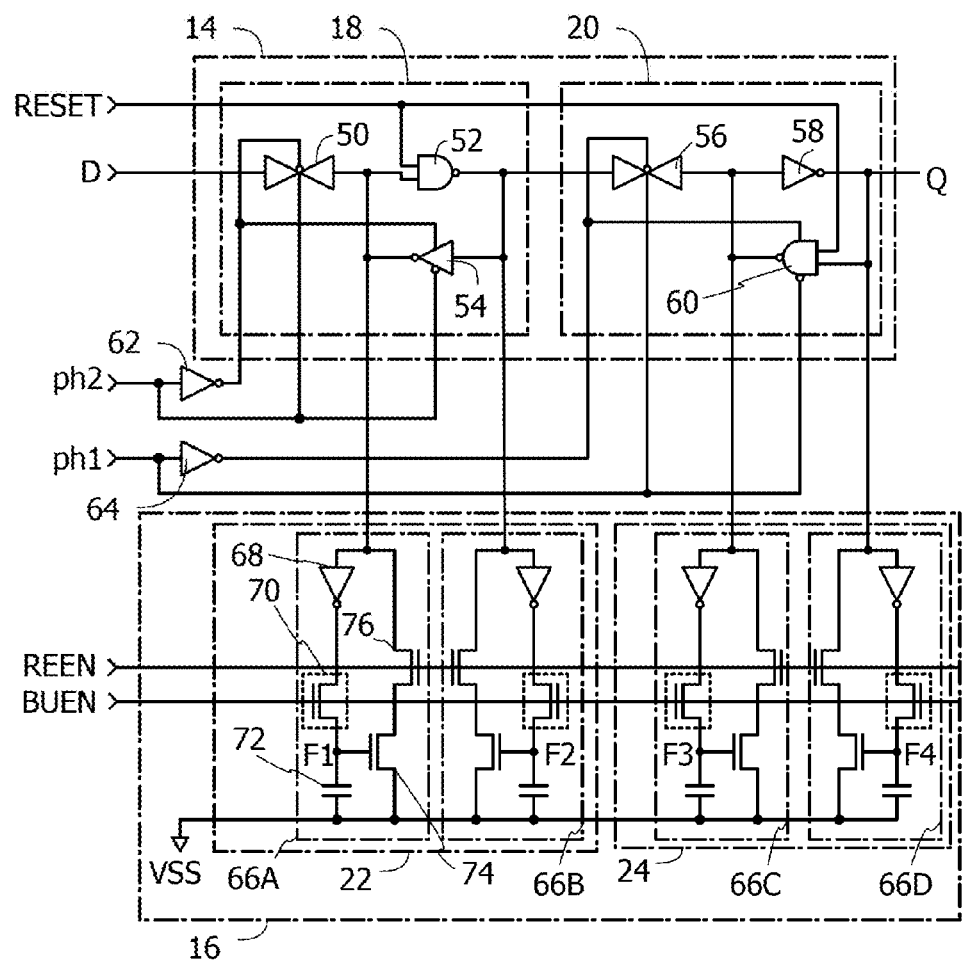
FIG. 3 is a circuit diagram for describing one embodiment of the present invention.

In the configuration of the data holding circuit in FIG. 3, the potential of the save control signal BUEN at H level is higher than a threshold voltage of the transistor 70. The potential of the save control signal BUEN at L level is lower than the threshold voltage of the transistor 70. With the configuration, the nodes F1 to F4 hold, as data, a potential lower than a potential held in a node included in an inverter loop by the threshold voltage of the transistor 70.

In the configuration of the data holding circuit in FIG. 3, by using potential differences between the nodes F1 and F2 and between the nodes F3 and F4, data of the FF circuit 14 is recovered. When one of the potentials of the nodes F1 and F2 and one of the potentials of the nodes F3 and F4 are relatively high, data can be held in the SR circuit 16. Accordingly, even when potentials decreased by the threshold voltage of the transistor 70 are held in the nodes F1 and F2 and the nodes F3 and F4, data of the FF circuit 14 can be recovered.

Furthermore, in the configuration of the data holding circuit in FIG. 3, even when charge held in the nodes F1 and F2 and the nodes F3 and F4 is decreased over time, it is possible to expand the acceptable range of decrease of charge, in which operation after data is held can be properly performed. For example, a potential V1 is held in the node F1 and a potential V2 (<V1) is held in the node F2. In such a case, when charge is decreased over time and potentials of both of the nodes are decreased by ΔV, the node F1 has a potential (V1−ΔV). The node F2 has a potential (V2+ΔV) in the case where the potential V2 is VSS or smaller than GND. Even in such a case, in the configuration of this embodiment, when one of the nodes F1 and F2 (here, the node F1) holds a relatively high potential, operation after data is held can be properly performed. Accordingly, the length of time in which data is held in the SR circuit 16 is easily extended.

In the configuration of the data holding circuit in FIG. 3, as described above, it is acceptable as long as one of the potentials of the nodes F1 and F2 and one of the potentials of the nodes F3 and F4 are relatively high; thus, a measure such as setting the potential of the save control signal BUEN at H level high in advance is not needed. Therefore, the number of voltage levels generated in a power supply circuit for supplying power supply voltage to the data holding circuit can be reduced and driving in which the amplitude of the save control signal BUEN is decreased can be performed.

The transistor 70 includes an oxide semiconductor as a semiconductor layer. Among paths of charge leakage from the nodes F1 to F4, the path through the source and the drain of the transistor 70 is dominant. However, since the off-state current of the transistor including an oxide semiconductor as the semiconductor layer is extremely small, in a period during which the transistor is off, the potentials of the nodes F1 to F4 can be kept substantially constant. For this reason, data can be held in the nodes F1 to F4 regardless of whether the power supply voltage is supplied.

The transistors 74 and 76 can be formed using any of a variety of semiconductor materials. For example, a material such as silicon or germanium can be used. Alternatively, it is possible to use a compound semiconductor or an oxide semiconductor. Note that as the transistors 74 and 76, a transistor whose mobility is high (for example, a transistor in which a channel is formed in single crystal silicon) is preferably used.

Figure 4:
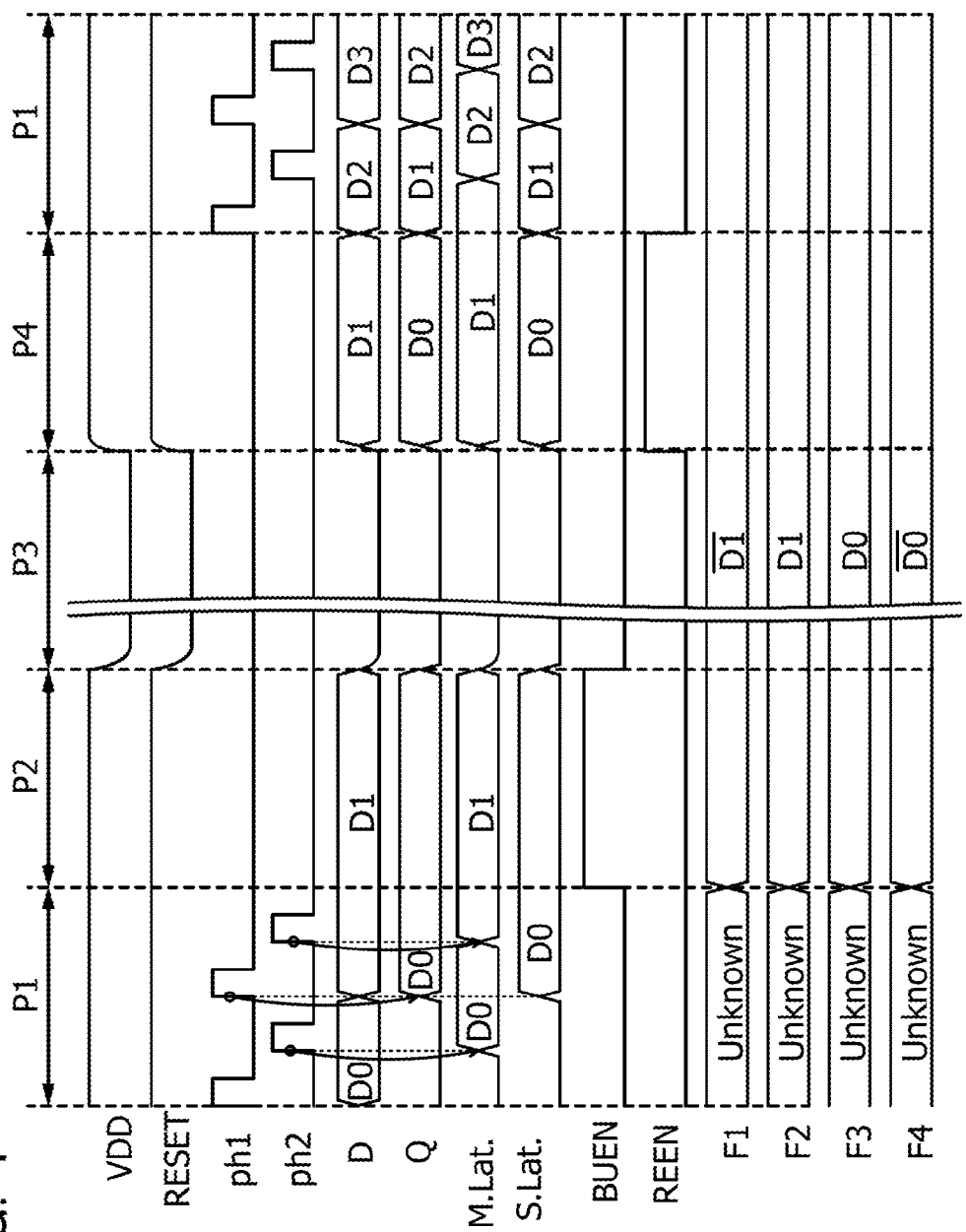
FIG. 4 is a timing chart for describing one embodiment of the present invention.

Next, operation of the data holding circuit 10 in FIG. 3 is described using a timing chart in FIG. 4.

In FIG. 4, VDD represents the potential of the power supply line which supplies a power supply potential to the data holding circuit 10. RESET represents the potential of a wiring which supplies a reset signal. Furthermore, ph1 represents change in the control signal ph1; ph2 represents change in the control signal ph2; D represents data of the data terminal; Q represents data of the output terminal; M.Lat. represents data held in the first latch circuit; S.Lat. represents data held in the second latch circuit; BUEN represents change in the save control signal BUEN; REEN represents change in the restore control signal REEN; and F1 to F4 represent data held in the nodes F1 to F4.

The input/output data and the held data have H-level potentials or L-level potentials and are denoted by "D0" to "D3" in the input order here. The inverted value of "D0" is denoted by "D0_b". In the diagram, the inverted value of "D0" is denoted by "D0" with an over line.

In the timing chart in FIG. 4, the periods P1 to P4 represent the normal operation, the data saving, the power supply stop, and the data restoring which are shown in FIG. 1B.

In the period P1, when the save control signal BUEN and the restore control signal REEN are at L level, and the control signals ph1 and ph2 are at H level, data is transferred to the first and second latch circuits. The transferred data is held in the inverter loops included in the first and second latch circuits. In the period P1, the potentials of the nodes F1 to F4 are undefined values; however, data written in the previous period is stored in some cases.

Next, in the period P2, by setting the save control signal BUEN at H level, the control signals ph1 and ph2 are fixed at L level. At this time, the first latch circuit holds data "D1" in the inverter loop. The second latch circuit holds data "D0" in the inverter loop. As for the fetched data, potentials with inverted logic level are supplied to the nodes F1 to F4; thus, the potential of the node F1 becomes "D1_b". Similarly, the potentials of the nodes F2 to F4 become "D1", "D0", and "D0_b", respectively.

In the period P3, the supply of power supply voltage is stopped and the save control signal BUEN is set at L level. At this time, the nodes F1 to F4 become floating and store data. In this manner, data is stored in the SR circuit 16 and data in the FF circuit 14 is lost.

In the period P4, the supply of power supply voltage is restarted and the restore control signal REEN is set at H level; thus, the control signals ph1 and ph2 are fixed at L level. At this time, potentials of the nodes included in the inverter loop in each of the first and second latch circuits are determined by a channel resistance difference among the transistors 74 in the memory circuits 66A to 66D. Therefore, a potential difference occurs in the potentials of the nodes included in the inverter loop in each of the first and second latch circuits, and data can always be recovered in accordance with the nodes F1 to F4.

In another period P1, the restore control signal REEN becomes L level, and normal operation is performed and data transferring and data holding are restarted.

In the data holding circuit in this embodiment, by the control signal generation circuit 12 shown in FIGS. 2A to 2C, the control signal ph1 and the control signal ph2 at L level can be output in data saving and data restoring. The data holding circuit shown in FIG. 3 and FIG. 4 can reduce the following malfunction: when data is saved or restored between the first and second latch circuits 18 and 20 and the nonvolatile memory circuits 22 and 24 in power supply stop, the first latch circuit or the second latch circuit fetches new data different from one to be saved (or restored).

In the above-described configuration in this embodiment, the data holding circuit which includes the FF circuit including the volatile memory portion including the first latch circuit and the second latch circuit and the SR circuit including the nonvolatile memory portion; and the control signal generation circuit which generates a first control signal supplied to the first latch circuit and a second control signal supplied to the second latch circuit. The SR circuit is a circuit in which data saving from or data restoring to the first latch circuit and the second latch circuit is controlled on the basis of the save control signal or the restore control signal. The control signal generation circuit is a circuit which generates a first control signal and a second control signal at L level in a period during which data is saved or restored, on the basis of the clock signal, the save control signal, and the restore control signal.

This configuration enables the data holding circuit to save data from the FF circuit to the SR circuit when power supply is stopped, and restore the data from the SR circuit to the FF circuit when the power supply is restarted; thus, data can be held even when the power supply is stopped. Through such data saving and data restoring, data before the power supply stop is not lost even after the power supply is restarted, and interrupted arithmetic processing can be restarted. Thus, intermittent power gating of the data holding circuit can be performed, so that power consumption can be reduced.

In the case where the above data saving and data restoring are applied to an FF circuit including a first latch circuit and a second latch circuit, a malfunction due to data racing needs to be prevented, and according to one embodiment of the present invention, a control signal generation circuit generates a first control signal and a second control signal at L level in a period during which data is saved or restored, on the basis of a clock signal, a save control signal, and a restore control signal. Therefore, the following malfunction can be reduced: in the case where control signals supplied to the first latch circuit and the second latch circuit are changed during data saving or data restoring, the first latch circuit or the second latch circuit in the FF circuit fetches new data different from one to be saved (or restored).

This embodiment can be implemented in appropriate combination with any of the other embodiments.

Embodiment 2

In this embodiment, a modification example of the control signal generation circuit 12 described in Embodiment 1 is described.

Modification Example 1

Figure 5A:
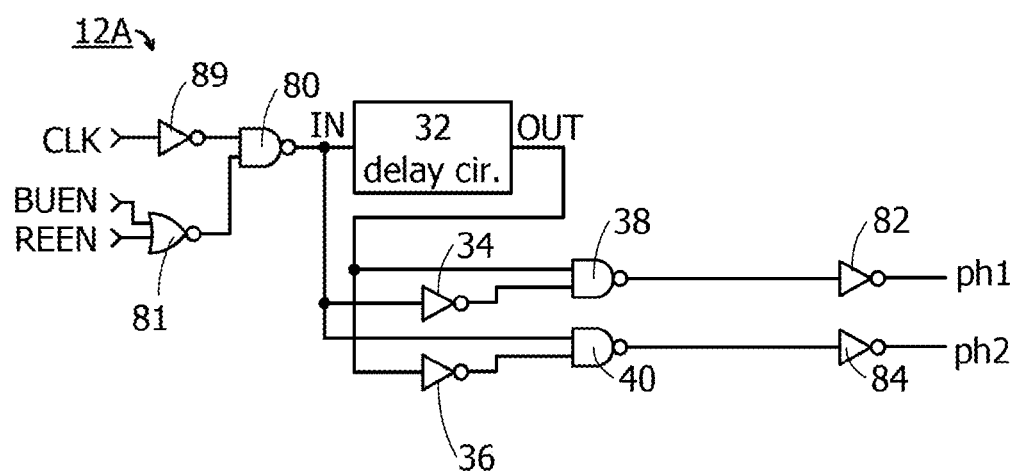
FIGS. 5A and 5B are a circuit diagram and a timing chart for describing one embodiment of the present invention.

FIG. 5A shows a modification example of the circuit configuration of the control signal generation circuit 12 in FIGS. 2A to 2C. The control signal generation circuit 12A includes a NAND circuit 80, a NOR circuit 81, the delay circuit 32, the inverter circuits 34 and 36, the NAND circuits 38 and 40, and inverter circuits 82 and 84.

A signal output by inputting the save control signal BUEN and the restore control signal REEN to the NOR circuit 81 and a clock signal CLK are input to the NAND circuit 80, so that a wavelength of a clock signal CLK for toggle operation only in normal operation can be obtained in the input portion N. The signal obtained in the input portion N is supplied to an input portion N of the delay circuit 32, so that a delayed signal is generated in an output portion OUT of the delay circuit 32. The signal of the input portion N through the inverter circuit 34 and the signal of the output portion OUT are input to the NAND circuit 38 and then the resulting signal is inverted by the inverter circuit 82, and the control signal ph1 is obtained. The signal of the output portion OUT through the inverter circuit 36 and the signal of the input portion N are input to the NAND circuit 40 and then the resulting signal is inverted by the inverter circuit 84, and the control signal ph2 is obtained.

Figure 5B:
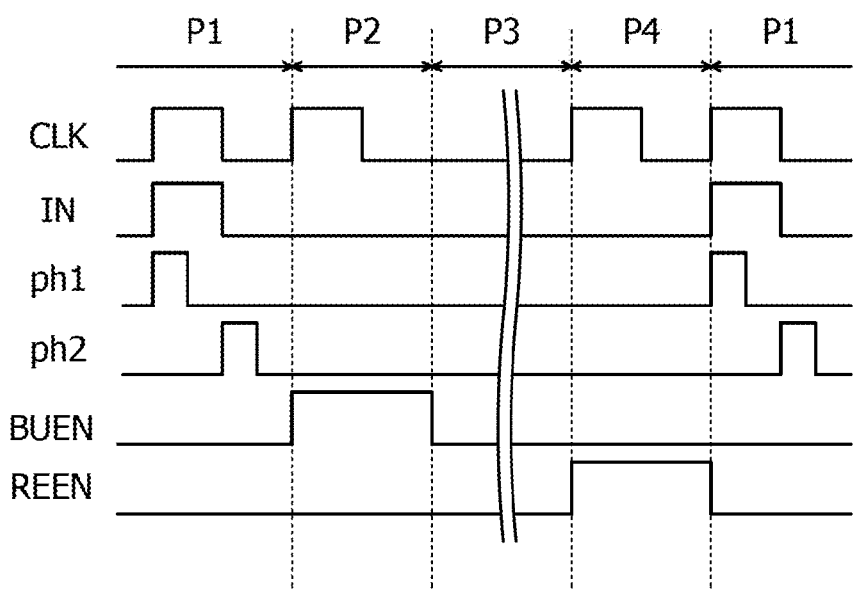

FIG. 5B is a timing chart of signals obtained in the control signal generation circuit 12A in FIG. 5A. FIG. 5B, like FIG. 1B, is a schematic timing chart of the signals in FIG. 5A in P1 to P4.

According to one embodiment of the present invention, as shown in FIG. 5B, the control signal generation circuit can output the control signal ph1 and the control signal ph2 at L level in the data saving and the data restoring. The data holding circuit having the above configuration can reduce a malfunction in which, when data is saved or restored between the first and second latch circuits 18 and 20 and the nonvolatile memory circuits 22 and 24 in the power supply stop, the first latch circuit or the second latch circuit fetches new data different from one to be saved (or restored).

In addition, in the configuration of the control signal generation circuit in FIG. 5A, the signal of the input portion N can be controlled to be L level in the data saving and the data restoring. With the configuration, signals output from the delay circuit 32, the inverter circuits 34 and 36, and the NAND circuits 38 and 40 which are included in the control signal generation circuit 12A can be set at L level in the data saving and the data restoring. Therefore, dynamic power consumption needed for charging and discharging wirings can be reduced.

Modification Example 2

Figure 6A:
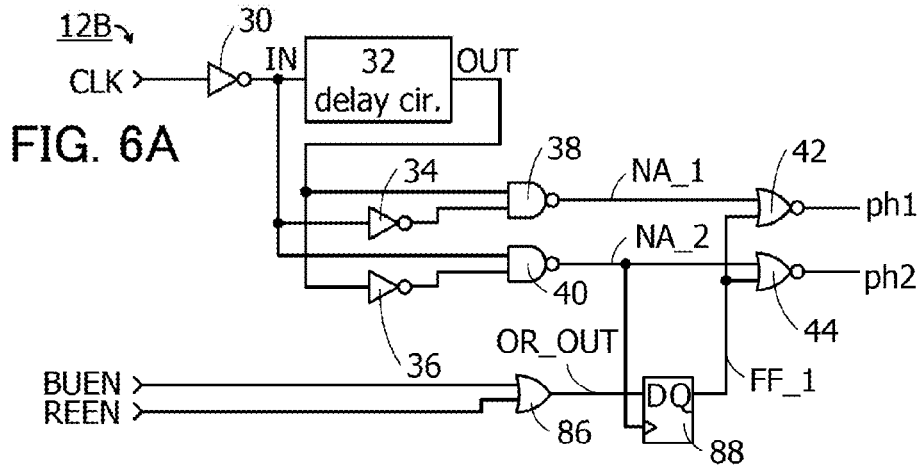
FIGS. 6A to 6C are circuit diagrams and a timing chart for describing one embodiment of the present invention.

FIG. 6A shows another modification example of the circuit configuration of the control signal generation circuit 12 in FIGS. 2A to 2C. The control signal generation circuit 12B includes the inverter circuit 30, the delay circuit 32, the inverter circuits 34 and 36, the NAND circuits 38 and 40, the NOR circuits 42 and 44, an OR circuit 86, and a D flipflop circuit 88 (hereinafter, referred to as a DFF circuit 88).

When the clock signal CLK is input to the inverter circuit 30, an inverted clock signal is generated. The inverted clock signal is input to an input portion IN of the delay circuit 32 so that a delayed and inverted clock signal is generated in an output portion OUT of the delay circuit 32. The signal of the input portion IN through the inverter circuit 34 and the signal of the output portion OUT are input to the NAND circuit 38, and a signal at a node NA_1 is obtained. The signal of the output portion OUT through the inverter circuit 36 and the signal of the input portion IN are input to the NAND circuit 40, and a signal at a node NA_2 is obtained.

The save control signal BUEN and the restore control signal REEN are input to the OR circuit 86. A signal (OR OUT) obtained in the OR circuit 86 is supplied as input data D of the DFF circuit 88. The input data is taken into the latch circuit in the flipflop circuit at the edge of rise of the signal at the node NA_2. In accordance with change in a potential held in the latch circuit, an output signal of the DFF circuit 88 is obtained.

Figure 6B:
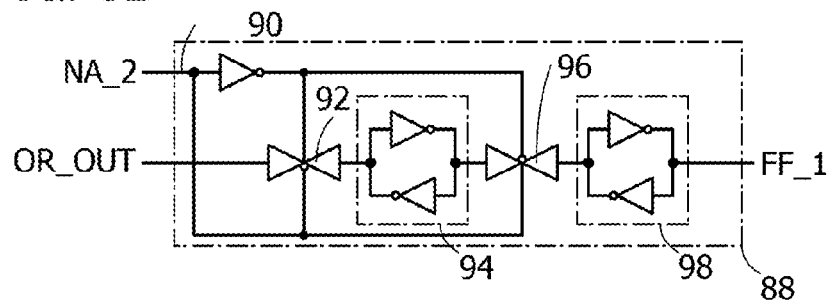

FIG. 6B shows an example of a circuit functioning as the DFF circuit 88. The DFF circuit 88 includes an inverter circuit 90, an analog switch 92, a latch circuit 94, an analog switch 96, and a latch circuit 98. In the DFF circuit 88, a signal which is at L level at the node NA_2 is taken into the latch circuit 94 and held in the latch circuit 98 at the edge of rise, so that a signal supplied from the DFF circuit 88 to the NOR circuit 44 (a signal at a node FF_1) can be generated.

The signal at the node FF_1 becomes H level after one of the save control signal BUEN and the restore control signal REEN becomes H level and then the edge of rise of the signal at the node NA_2 occurs. In other words, the signal at the node FF_1 becomes H level after the control signal ph2 becomes H level. In this case, the following does not occur: before or during the rise of the control signal ph2, the save control signal BUEN or the restore control signal REEN becomes H level and data is not taken. Therefore, after the control signal ph2 rises and data is taken, a data saving period and a data restoring period can be provided.

The signal at the node FF_1 which is obtained in the DFF circuit 88 and the signal at the node NA_1 are input to the NOR circuit 42, and the control signal ph1 is obtained. Furthermore, the signal at the node FF_1 which is obtained in the DFF circuit 88 and the signal at the node NA_2 are input to the NOR circuit 44, and the control signal ph2 is obtained.

Figure 6C:
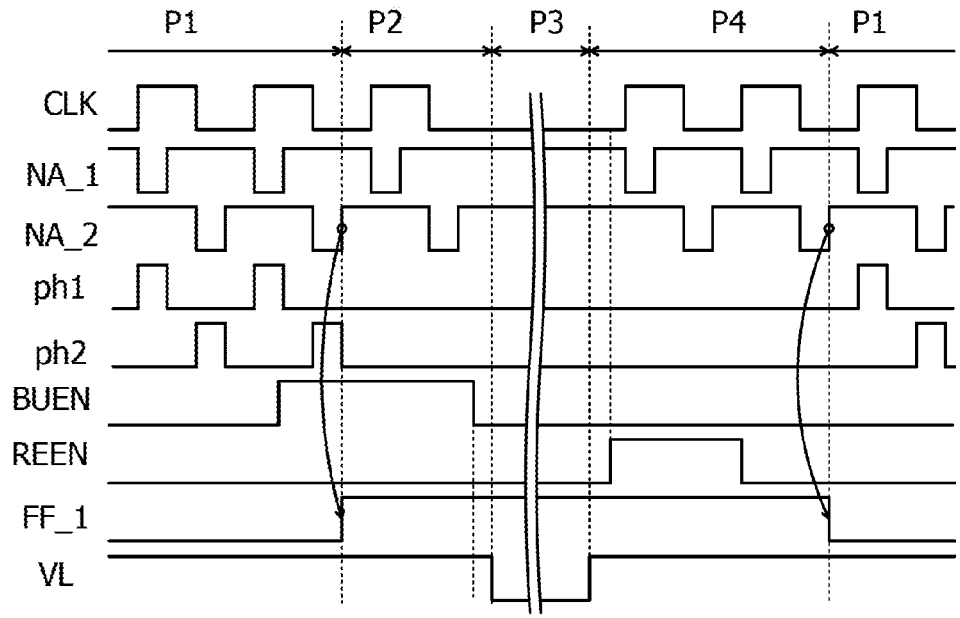

FIG. 6C is a timing chart of signals obtained in the control signal generation circuit 12B in FIG. 6A. FIG. 6C, like FIG. 1B, is a schematic timing chart of the signals in FIG. 6A in P1 to P4.

According to one embodiment of the present invention, as shown in FIG. 6C, the control signal generation circuit can output the control signal ph1 and the control signal ph2 at L level in the data saving and the data restoring. The data holding circuit having the above configuration can reduce a malfunction in which, when data is saved or restored between the first and second latch circuits 18 and 20 and the nonvolatile memory circuits 22 and 24 in the power supply stop, the first latch circuit or the second latch circuit fetches new data different from one to be saved (or restored).

In addition, in the configuration of the control signal generation circuit in FIG. 6C, after the control signal ph2 rises and data is taken, the signal at the node FF_1 becomes H level; thus, a data saving period in which the control signal ph1 and the control signal ph2 are at L level can be provided. In the configuration of the control signal generation circuit in FIG. 6C, a data restoring period can be provided in such a manner that the control signal ph2 rises and then the signal at the node FF_1 is changed from H level to L level at the timing when the control signal ph1 becomes H level. In this case, regardless of change in the save control signal BUEN and the restore control signal REEN, operation in the data saving period and the data restoring period can be performed. Therefore, the control signal ph1 and the control signal ph2 can be generated in the data saving period and the data restoring period in which a malfunction is reduced.

Modification Example 3

Figure 7A:
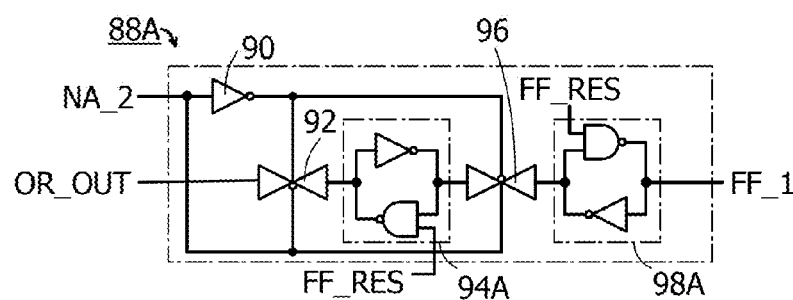
FIGS. 7A and 7B are a circuit diagram and a timing chart for describing one embodiment of the present invention.

FIG. 7A shows a modification example of the circuit configuration of the DFF circuit 88 in FIG. 6B. A DFF circuit 88A includes the inverter circuit 90, the analog switch 92, a latch circuit 94A, the analog switch 96, and a latch circuit 98A. The latch circuit 94A and the latch circuit 98A include an inverter circuit and a NAND circuit to which a reset signal FF_RES is supplied.

The DFF circuit 88A can be controlled to hold H level forcibly by supplying an L-level signal as the reset signal FF_RES to the latch circuit 94A and the latch circuit 98A. In this case, even when the supply of power supply voltage to the DFF circuit 88 is stopped in the power supply stop, a signal at the node FF_1 can be forcibly held at H level after the restart. Thus, even when the supply of power supply voltage is restarted after the stop, the function of the control signal generation circuit can be maintained. Note that the reset signal FF_RES is set at L level shortly before the supply of power supply voltage is stopped, and is set at L level shortly after the supply of power supply voltage is restarted. With the configuration, the data saving period and the data restoring period in which the control signal ph1 and the control signal ph2 are at L level.

Figure 7B:
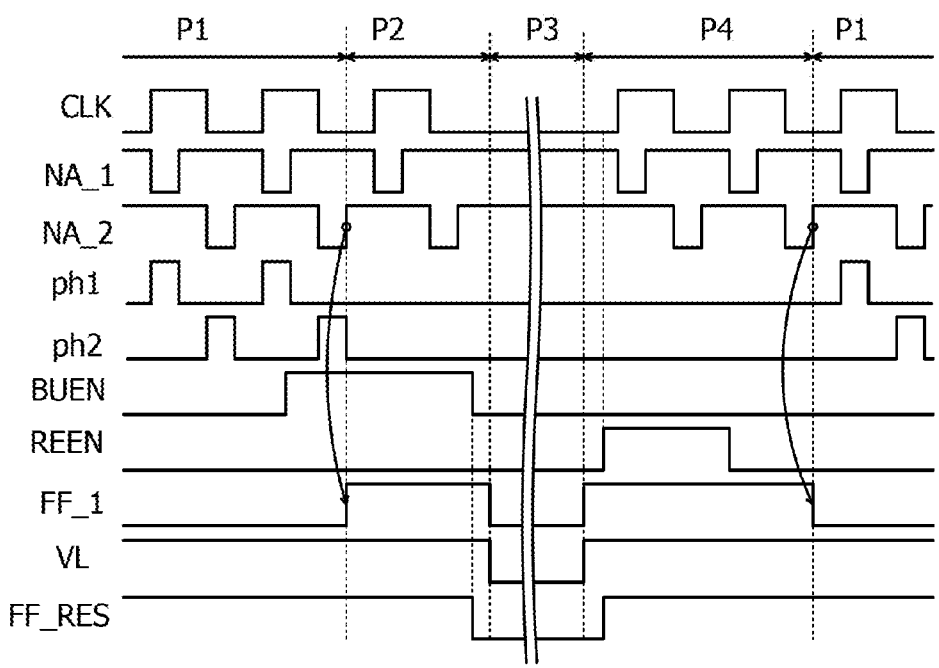

FIG. 7B is a timing chart of signals obtained in the case where the DFF circuit 88A in FIG. 7A is used for the control signal generation circuit 12B in FIG. 6A. FIG. 7B is a schematic timing chart of the signals in FIG. 6A and the reset signal FF_RES in P1 to P4.

According to one embodiment of the present invention, as shown in FIG. 7B, the control signal generation circuit can output the control signal ph1 and the control signal ph2 at L level in the data saving and the data restoring. The data holding circuit having the above configuration can reduce a malfunction in which, when data is saved or restored between the first and second latch circuits 18 and 20 and the nonvolatile memory circuits 22 and 24 in the power supply stop, the first latch circuit or the second latch circuit fetches new data different from one to be saved (or restored).

In addition, in the case where the DFF circuit 88A in FIG. 7A is used for the control signal generation circuit 12B in FIG. 6A, even when the supply of power supply voltage to the DFF circuit 88 is stopped, the signal at the node FF_1 can be forcibly held at H level after the restart. Therefore, operation in which a malfunction is reduced and which can reduce power consumption can be performed.

This embodiment can be implemented in appropriate combination with any of the other embodiments.

Embodiment 3

In this embodiment, application examples of the semiconductor device are described with specific examples. In particular, in this embodiment, application examples of the semiconductor device to a programmable logic device (PLD) or a central processing unit (CPU) are described.

Figure 8:
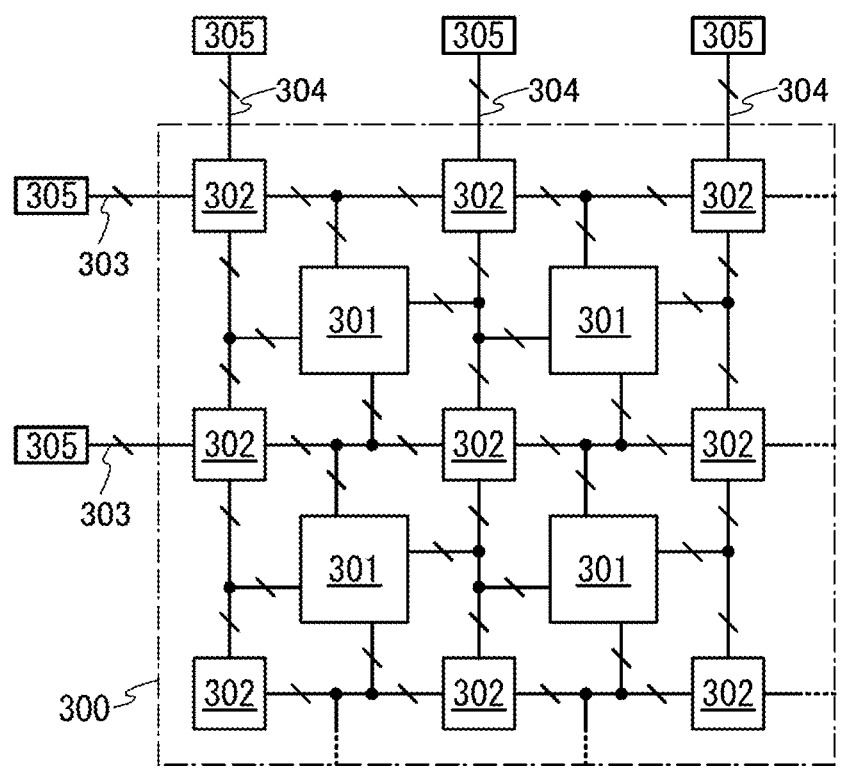
FIG. 8 is a block diagram for describing one embodiment of the present invention.

FIG. 8 is an example of a block diagram of a logic array included in a PLD. A logic array 300 includes a plurality of logic elements (LEs) 301 arranged in an array. Here, the expression "arranged in an array" means that the logic elements are arranged in a matrix at regular intervals, and the arrangement is not limited to that illustrated in FIG. 8.

A plurality of wirings are formed to surround the LEs 301. In FIG. 8, these wirings consist of a plurality of horizontal wiring groups 303 and a plurality of vertical wiring groups 304. A wiring group is a bundle of a plurality of wirings. A switch portion 302 is provided at an intersection of the horizontal wiring group 303 and the vertical wiring group 304. The horizontal wiring groups 303 and the vertical wiring groups 304 are connected to input/output terminals 305 to transmit and receive signals to and from a circuit provided outside the logic array 300.

Input/output terminals of the plurality of LEs 301 are connected to the horizontal wiring groups 303 and the vertical wiring groups 304 provided around the LEs 301. For example, in FIG. 8, the input/output terminals of the LEs 301 are connected to the horizontal wiring groups 303 and the vertical wiring groups 304 up and down, left and right. With the use of these input/output terminals, each of the LEs 301 can be connected to another LE 301. A connection path between one LE 301 and another LE 301 is determined by a switch for switching connection between wirings provided in the switch portion 302.

On/off of the switch for switching connection between wirings in the switch portion 302 is determined in accordance with a configuration memory which stores configuration data. In the case of a rewritable structure, the configuration memory provided in the switch portion 302 preferably includes a nonvolatile memory element to prevent loss of stored configuration data due to a stop of the power supply in power gating.

As the nonvolatile memory element, a flash memory, a ferroelectric random access memory (FeRAM), a magnetoresistive random access memory (MRAM), a phase change random access memory (PRAM), a resistance random access memory (ReRAM), or the like can be used. Alternatively, a circuit which holds data by holding charge and which utilizes an extremely low off-state current of a transistor including an oxide semiconductor layer may be used as the nonvolatile memory element. By forming a nonvolatile memory element using a transistor including an oxide semiconductor layer, the transistor and a transistor including a silicon layer can be stacked.

Figure 9:
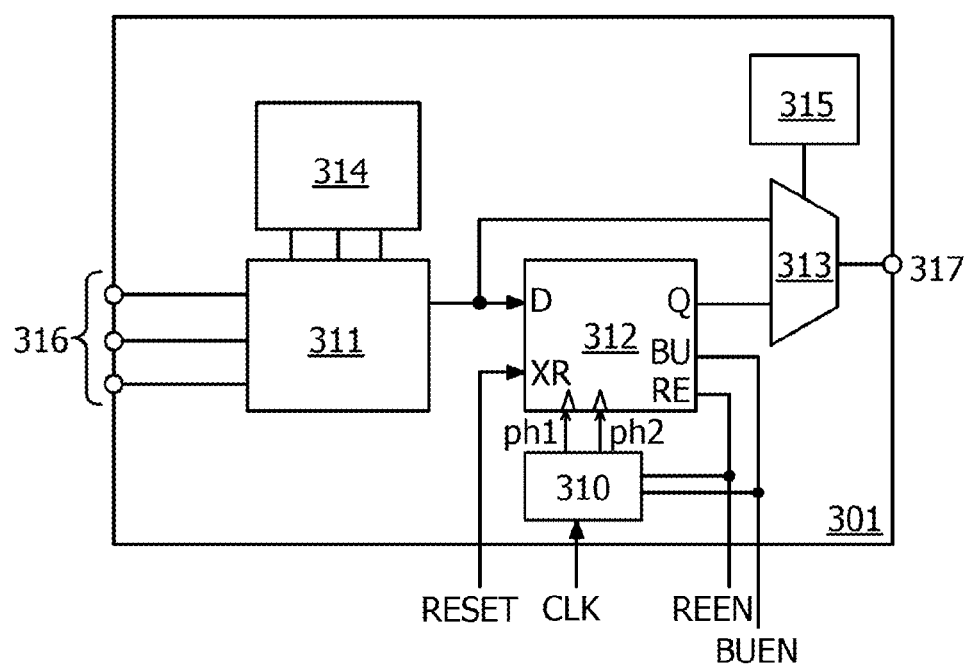
FIG. 9 is a block diagram for describing one embodiment of the present invention.

FIG. 9 is an example of a block diagram of the LE 301 in FIG. 8. The LE 301 in FIG. 9 includes, for example, a look up table (LUT) 311, a data holding circuit 312, and a multiplexer 313. Furthermore, in FIG. 9, configuration memories 314 and 315 connected to the LUT 311 and the multiplexer 313, respectively, are provided. In FIG. 9, a control signal generation circuit 310 connected to the data holding circuit 312 is provided.

Figure 13:
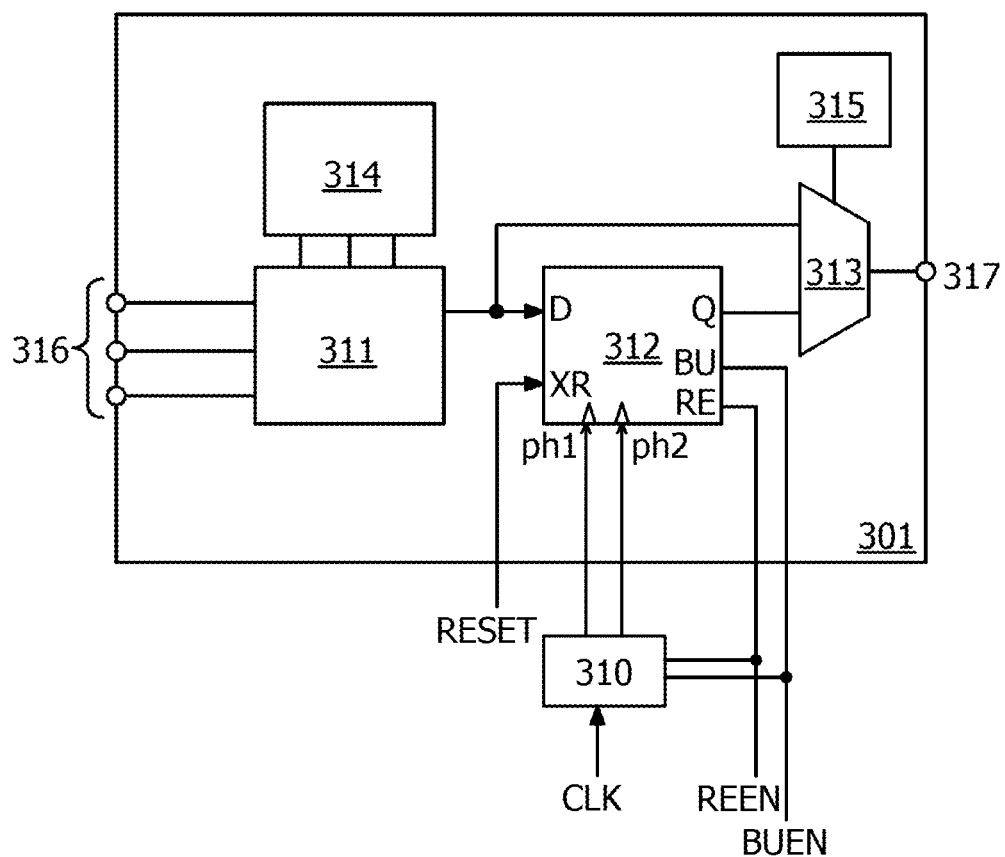
FIG. 13 is a block diagram for describing one embodiment of the present invention.

Although FIG. 9 shows a configuration in which the control signal generation circuit 310 is provided in the LE 301, the control signal generation circuit 310 may be provided outside the LE 301 as shown in FIG. 13. This configuration can reduce the number of the control signal generation circuits 310, and the size of the circuit of the LE 301 can be reduced.

In the case of a rewritable structure, the configuration memories 314 and 315 each preferably include a nonvolatile memory element to prevent loss of stored configuration data due to a stop of the power supply in power gating.

The configuration data refers to data of the LUT 311, information on selection of input signals of the multiplexer 313, and data for selecting the on state and off state of the switch portion 302, for example. The configuration memory refers to a memory element for storing the configuration data.

A logic circuit determined by the LUT 311 varies depending on the content of configuration data stored in the configuration memory 314. When the configuration data is determined, one output value of the LUT 311 with respect to input values of a plurality of input signals input to input terminals 316 is determined. Then, the LUT 311 outputs a signal including the output value.

The data holding circuit 312 is the data holding circuit described in any of the above embodiments. The data holding circuit 312 holds a signal output from the LUT 311 by being synchronized with the control signals ph1 and ph2 output from the control signal generation circuit 310 and outputs the signal to the multiplexer 313. Data is saved or restored between the FF circuit and the SR circuit by the save control signal BUEN and the restore control signal REEN to prevent loss of held data due to a stop of the power supply in power gating.

The control signal generation circuit 310 is the control signal generation circuit described in any of the above embodiments. The control signal generation circuit 310 can generate the control signals ph1 and ph2 on the basis of the clock signal CLK, the save control signal BUEN, and the restore control signal REEN. The generated control signals ph1 and ph2 are, as described in the above embodiments, signals capable of controlling the first latch circuit and the second latch circuit in the data saving or the data restoring to prevent a malfunction.

The output signal from the LUT 311 and the output signal from the data holding circuit 312 are input to the multiplexer 313. The multiplexer 313 has a function of outputting either of the two output signals in accordance with configuration data held in the configuration memory 315. The output signal from the multiplexer 313 is output from an output terminal 317.

According to one embodiment of the present invention, circuits, e.g., the data holding circuit and the control signal generation circuit described in any of the above embodiments are provided in an LE. Thus, a malfunction in data saving or data restoring can be prevented. By a stop of power supply in power gating, power consumption can be reduced.

Figure 10:
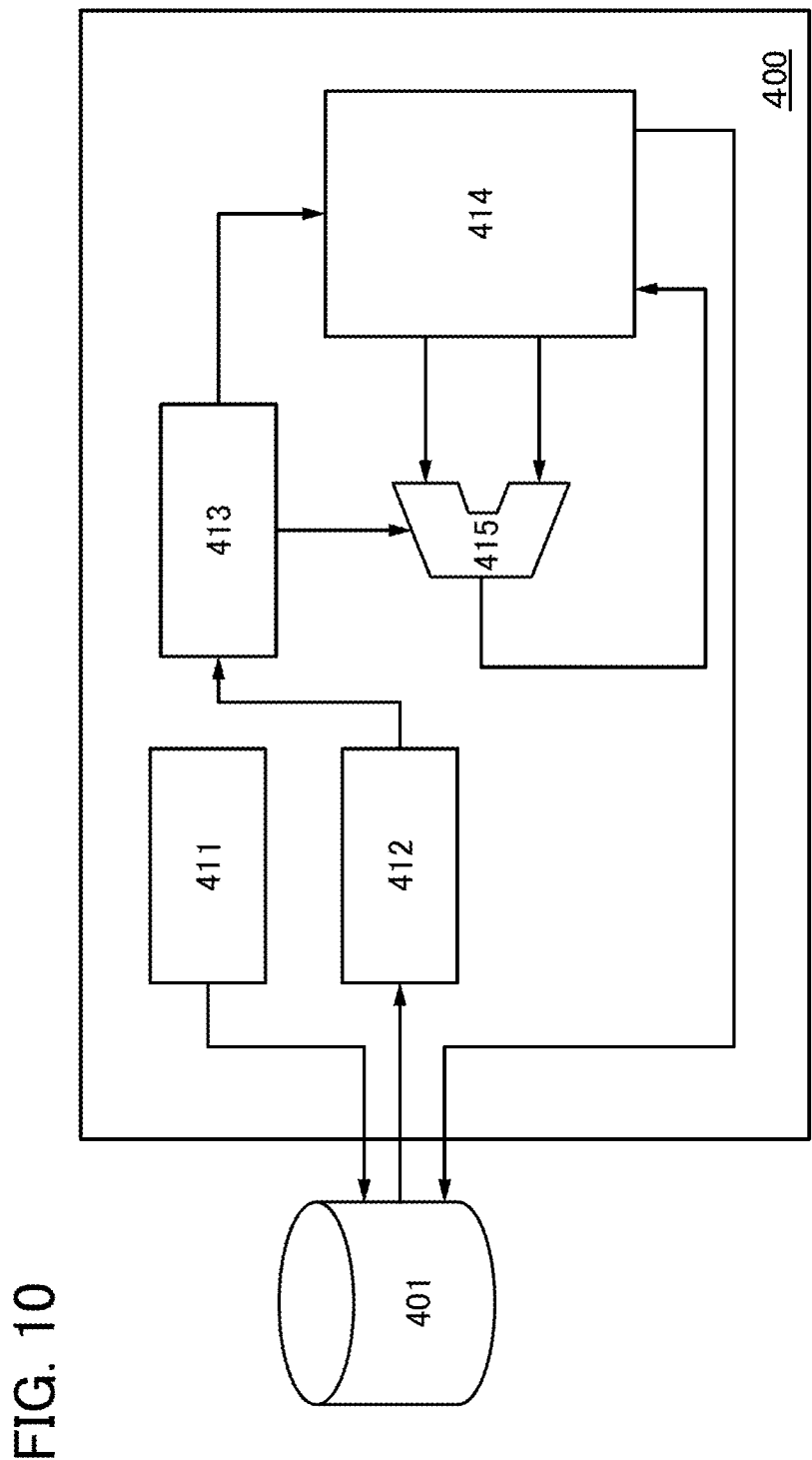
FIG. 10 is a block diagram for describing one embodiment of the present invention.

FIG. 10 illustrates an example of a block diagram of a CPU.

A CPU 400 includes a program counter 411, an instruction register 412, an instruction decoder 413, a general-purpose register 414, and an arithmetic logic unit (ALU) 415, for example. A main memory device 401 for inputting and outputting data to and from the CPU 400 is provided outside the CPU 400.

The program counter 411 is a register which stores an address of an instruction (command) to be read (fetched). The instruction register 412 is a register for temporarily storing data transmitted to the instruction decoder 413 from the main memory device 401. The instruction decoder 413 is a circuit which decodes input data and generates signals for specifying a register in the general-purpose register 414, a signal for specifying an arithmetic method in the ALU 415, and the like. The general-purpose register 414 can store data read from the main memory device 401, data obtained during the arithmetic operations in the ALU 415, data obtained as a result of the arithmetic operations of the ALU 415, or the like. The ALU 415 has a function of performing a variety of arithmetic operations such as four arithmetic operations and logic operations. In the CPU 400, a data cache or the like, that is, a circuit which temporarily stores an arithmetic result or the like, may be additionally provided.

Next, operation of the CPU 400 is described.

The CPU 400 gives an instruction to output an address of a read out instruction which is specified by the program counter 411 to the main memory device 401. Next, data, which is stored in the main memory device 401, is read from an address of the instruction to be carried out and stored in the instruction register 412.

The instruction decoder 413 decodes the data stored in the instruction register 412 and generates signals for performing the instruction. Specifically, the instruction decoder 413 generates a signal for specifying a register in the general-purpose register 414, a signal for specifying an arithmetic method in the ALU 415, and the like.

The general-purpose register 414 outputs data specified by the instruction decoder 413 to the ALU 415 or the main memory device 401 in accordance with the instruction. In the ALU, arithmetic operations are carried out in accordance with an arithmetic method specified by the instruction decoder 413, and an arithmetic result is stored in the general-purpose register 414.

After the CPU 400 carries out the instruction, the CPU 400 reads an instruction, decodes data read from the instruction register 412, and carries out the instruction.

In one embodiment of the present invention, the semiconductor device described in the above embodiment is applied to registers for temporarily storing data in circuits, such as the program counter 411, the instruction register 412, the instruction decoder 413, and the general-purpose register 414; thus, a malfunction in data saving or data restoring can be prevented. By a stop of power supply in power gating, power consumption can be reduced. Consequently, a malfunction of the CPU 400 and power consumption of the CPU 400 can be low.

This embodiment can be implemented in appropriate combination with any of the other embodiments.

Embodiment 4

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can include the semiconductor device of one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of such electronic devices are shown in FIGS. 11A to 11F.

Figure 11A:
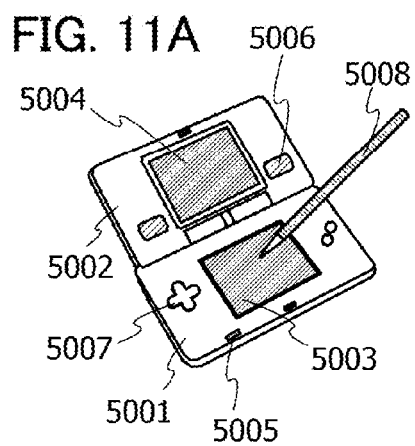
FIGS. 11A to 11F are diagrams illustrating examples of an electronic device.

FIG. 11A is a portable game console, which includes a housing 5001, a housing 5002, a display portion 5003, a display portion 5004, a microphone 5005, speakers 5006, operation keys 5007, a stylus 5008, and the like. Note that although the portable game console illustrated in FIG. 11A has the two display portions 5003 and 5004, the number of display portions included in the portable game console is not limited to two.

Figure 11B:
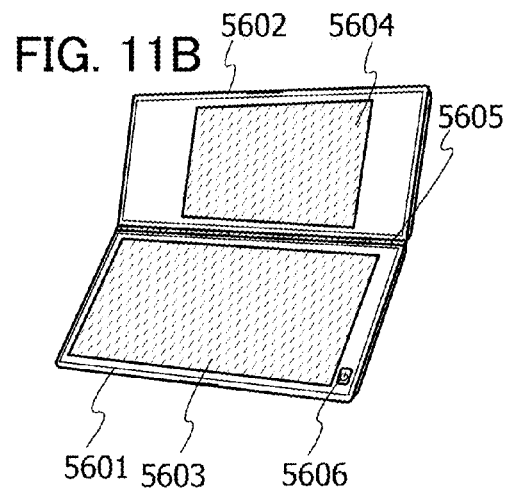

FIG. 11B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel portion of a display device.

Figure 11C:
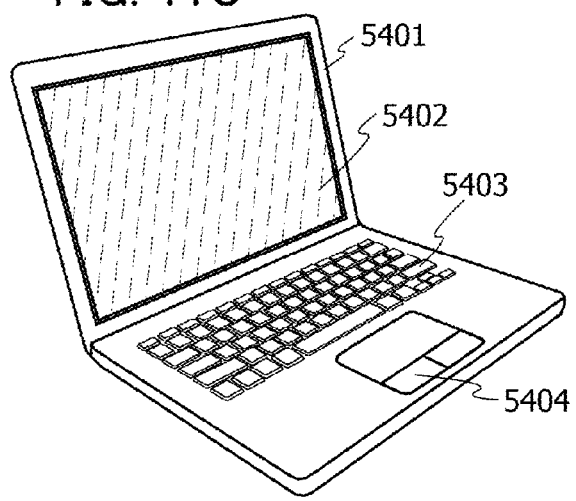

FIG. 11C illustrates a laptop personal computer, which includes a housing 5401, a display portion 5402, a keyboard 5403, a pointing device 5404, and the like.

Figure 11D:
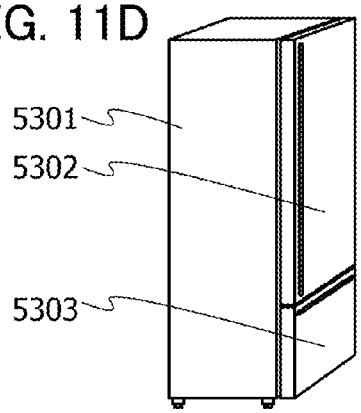

FIG. 11D illustrates an electric refrigerator-freezer, which includes a housing 5301, a refrigerator door 5302, a freezer door 5303, and the like.

Figure 11E:
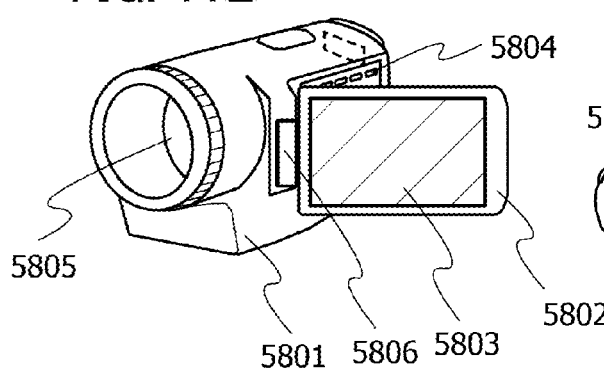

FIG. 11E illustrates a video camera, which include a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. An image on the display portion 5803 may be switched depending on the angle between the first housing 5801 and the second housing 5802 at the joint 5806.

Figure 11F:
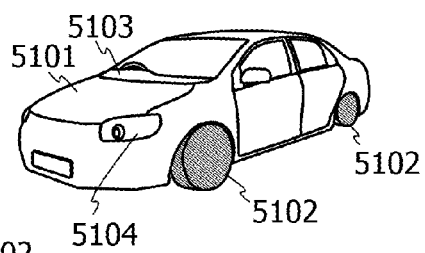

FIG. 11F illustrates an ordinary vehicle, which includes a car body 5101, wheels 5102, a dashboard 5103, lights 5104, and the like.

This embodiment can be implemented in appropriate combination with any of the other embodiments.

Example

As an application example of a semiconductor device using a two-phase clock, a field programmable gate array (FPGA) which is one of PLDs was fabricated. In this example, a specific configuration of the FPGA is described. The fabricated FPGA is a multi-context FPGA in which power gating can be performed in each programmable logic element (PLE) including a nonvolatile shadow register.

Figure 16:
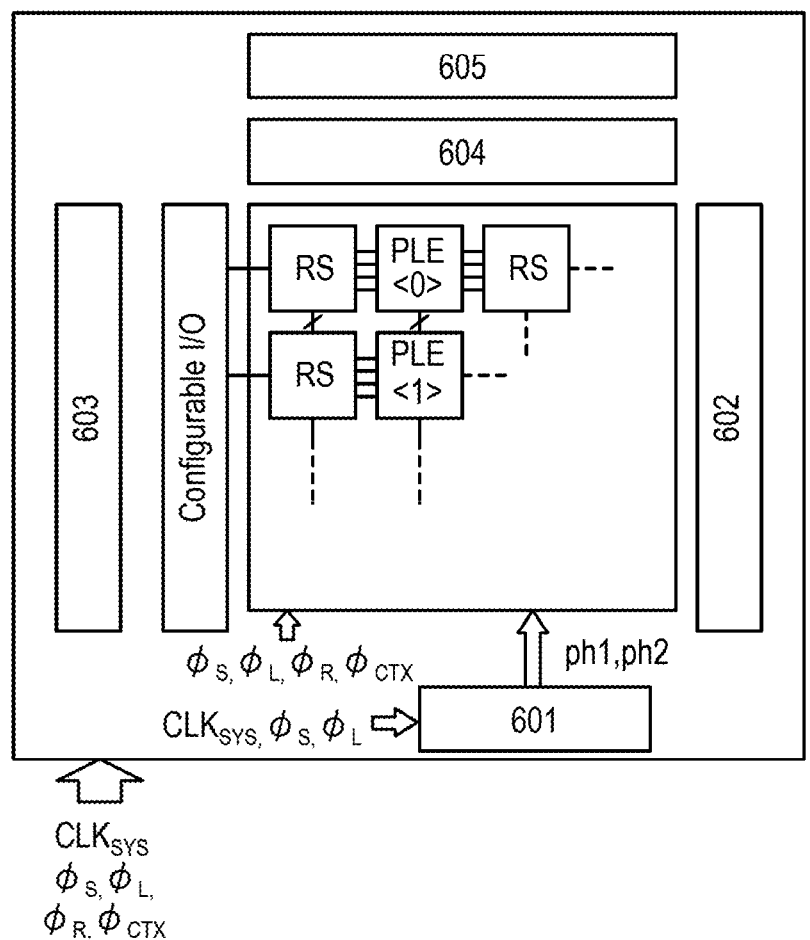
FIG. 16 is a block diagram for describing a configuration in Example.

FIG. 16 is a block diagram of the fabricated multi-context FPGA. In the following description, for correspondence to the drawing, the above-described save control signal BUEN is referred to as $\phi_S$ and the above-described restore control signal is referred to as $\phi_L$. The clock signal CLK is referred to as $CLK_{sys}$. The reset signal is referred to as $\phi_R$. A signal for switching context is referred to as $\phi_{CTX}$. The logic elements LE are denoted by PLE<0>, PLE<1>, and the like. The switch portion is referred to as RS representing routing switch.

In FIG. 16, a control signal generation circuit 601 (also referred to as Clock Generator in a drawing), a configurable input/output circuit 602 (also referred to as Configurable I/O in a drawing), a row decoder 603 (also referred to as Row Driver in a drawing), a column decoder 604 (also referred to as Column Driver in a drawing), and a configuration controller 605 are shown. Furthermore, the logic elements are programmable logic elements PLE<0> and PLE<1>, and the switch portion is a routing switch RS.

The programmable logic elements PLE<0> and PLE<1> can switch the function in accordance with configuration data stored in configuration memories. The routing switch RS can switch connection between wirings in accordance with the configuration memories storing configuration data.

Figure 17A:
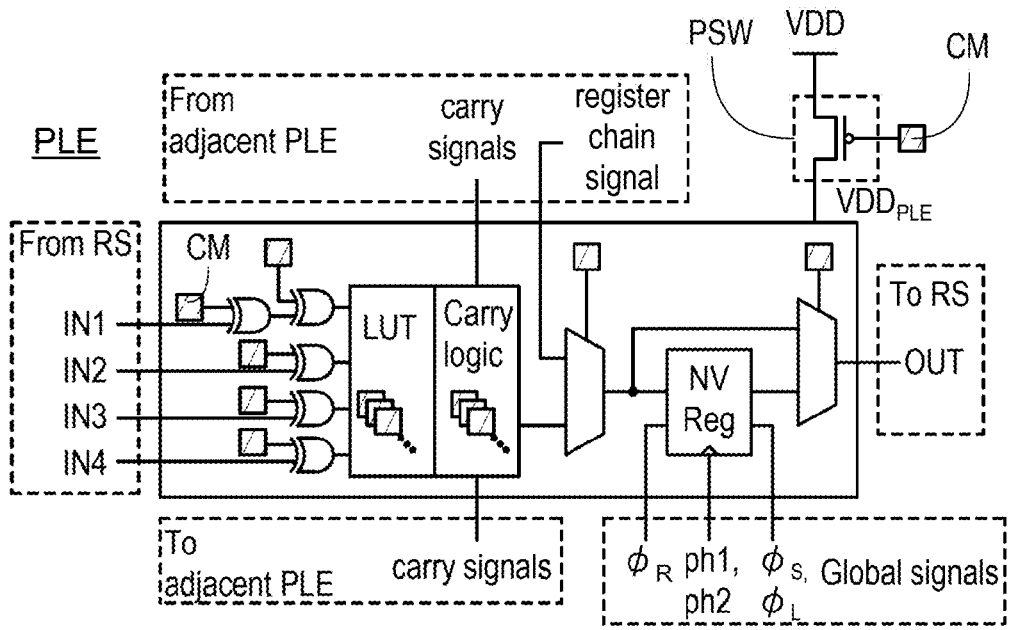
FIGS. 17A and 17B are circuit diagrams for describing a configuration in Example.

FIG. 17A shows a configuration example of a PLE applicable to the programmable logic elements PLE<0> and PLE<1>. In FIG. 17A, a 4-input lookup table LUT, a nonvolatile register NVReg, and the like are shown. Furthermore, the PLE is connected to a power switch PSW for performing power gating.

The lookup table LUT and the like include a configuration memory set CM which can be switched in accordance with the number of contexts. The function of the PLE can be switched by switching configuration data stored in the configuration memory set CM in accordance with the signal $\phi_{CTX}$ for switching context.

A gate of the power switch PSW is connected to the configuration memory set CM. On/Off of the power switch PSW is controlled in accordance with configuration data stored in the configuration memory set CM and a potential $VDD_{PLE}$ is switched in accordance with the number of contexts; thus, power gating is performed.

The nonvolatile register NVReg includes a plurality of shadow registers in accordance with the number of contexts. The nonvolatile register NVReg can control data saving or data restoring in accordance with $\phi_S$ and $\phi_L$ which correspond to the contexts.

Figure 17B:
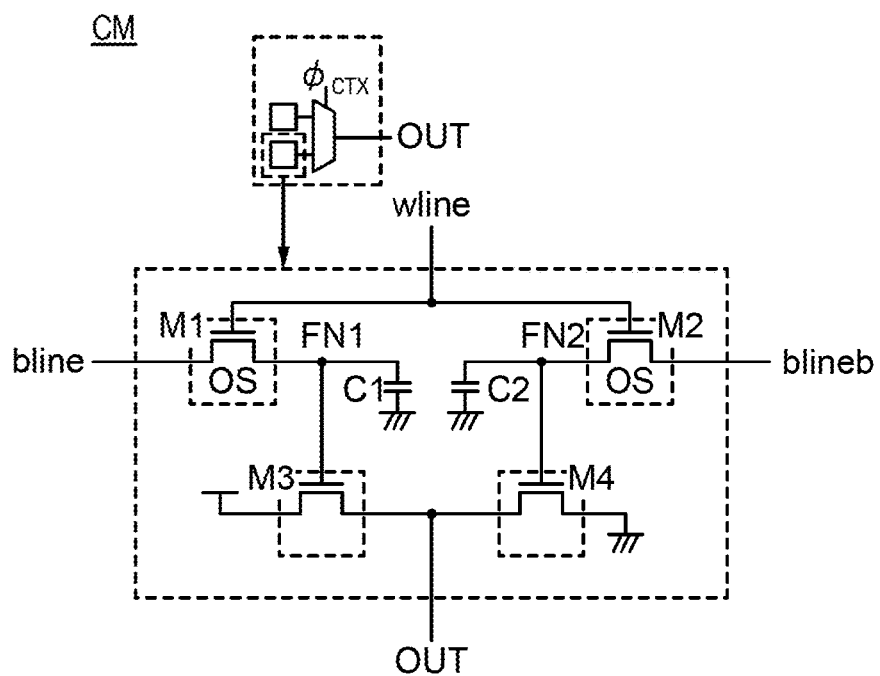

FIG. 17B shows a configuration example of the configuration memory set CM. The configuration memory set CM outputs an output signal of one of the configuration memories to OUT in accordance with the signal $\phi_{CTX}$.

FIG. 17B also shows an example of a circuit configuration of the configuration memory. In FIG. 17B, transistors M1 to M4 and capacitors C1 and C2 are shown. The configuration memory includes the transistors M1 and M2 which are OS transistors, and holds data using low off-state current characteristic of the OS transistor. Specifically, a wline is set at H level so that the transistors M1 and M2 are turned on and signals determined by the logic level of the bline and a blineb are written to and held in nodes FN1 and FN2. By selecting the on state of one of the transistors M3 and M4, an output signal at H level or L level is obtained.

Figure 18:
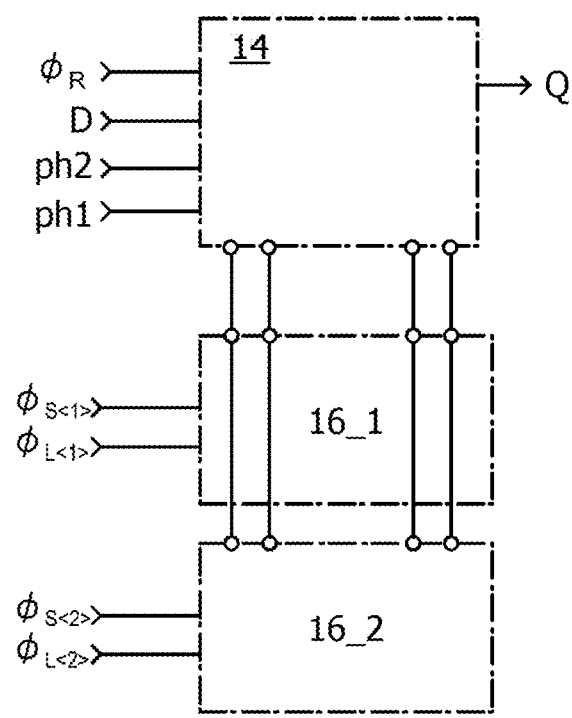
FIG. 18 is a circuit diagram for describing a configuration in Example.

FIG. 18 shows a configuration example of the nonvolatile register NVReg. The nonvolatile register NVReg includes the FF circuit 14 and the SR circuit 16 which are shown in FIG. 3 in Embodiment 1. The SR circuits are provided in accordance with the number of contexts and denoted by an SR circuit 16_1, an SR circuit 16_2, and the like.

The FF circuit 14 is supplied with data D, a signal $\phi_R$, and control signals ph1 and ph2 and outputs an output signal Q. For the circuit configuration, FIG. 3 in Embodiment 1 may be referred to.

The SR circuits 16_1 and 162 are supplied with $\phi_{S<i>}$ and $\phi_{L<1>}$, or $\phi_{S<2>}$ and $\phi_{L<2>}$ in accordance with a switched context. For example, in a context 1, data saving or data restoring may be controlled by $\phi_{S<1>}$ and $\Phi_{L<1>}$ which select the SR circuit 16_1. Similarly, in a context 2, data saving or data restoring may be controlled by $\phi_{S<2>}$ and $\phi_{L<2>}$ which select the SR circuit 16_2.

Figure 19:
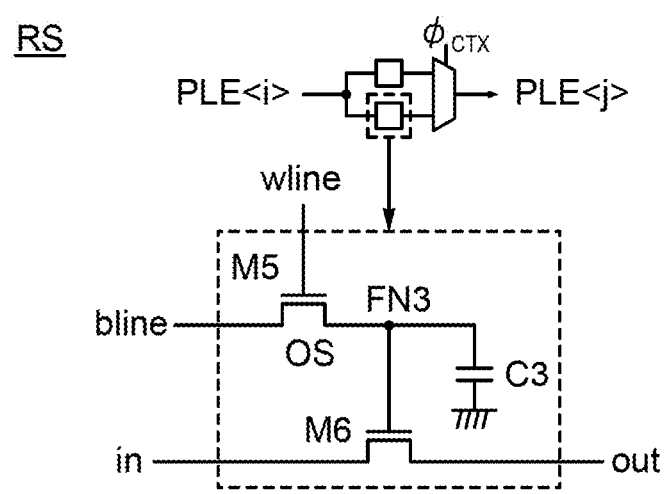
FIG. 19 is a circuit diagram for describing a configuration in Example.

FIG. 19 shows a configuration example of the routing switch RS. The routing switch RS includes a configuration memory in accordance with a context and switches connection between PLE<i> and PLE<j> in accordance with the signal $\phi_{CTX}$.

FIG. 19 also shows an example of a circuit configuration of the configuration memory of the routing switch RS. In FIG. 19, transistors M5 and M6 and a capacitor C3 are shown. The configuration memory in FIG. 19 includes the transistor M5 which is an OS transistor, and holds data using low off-state current characteristic of the OS transistor. Specifically, the wline is set at H level so that the transistor M5 is turned on and a signal of the bline is written to and held in a node FN3. By selecting the on state of one of the transistors M5 and M6, connection between in and out is switched.

Figure 20:
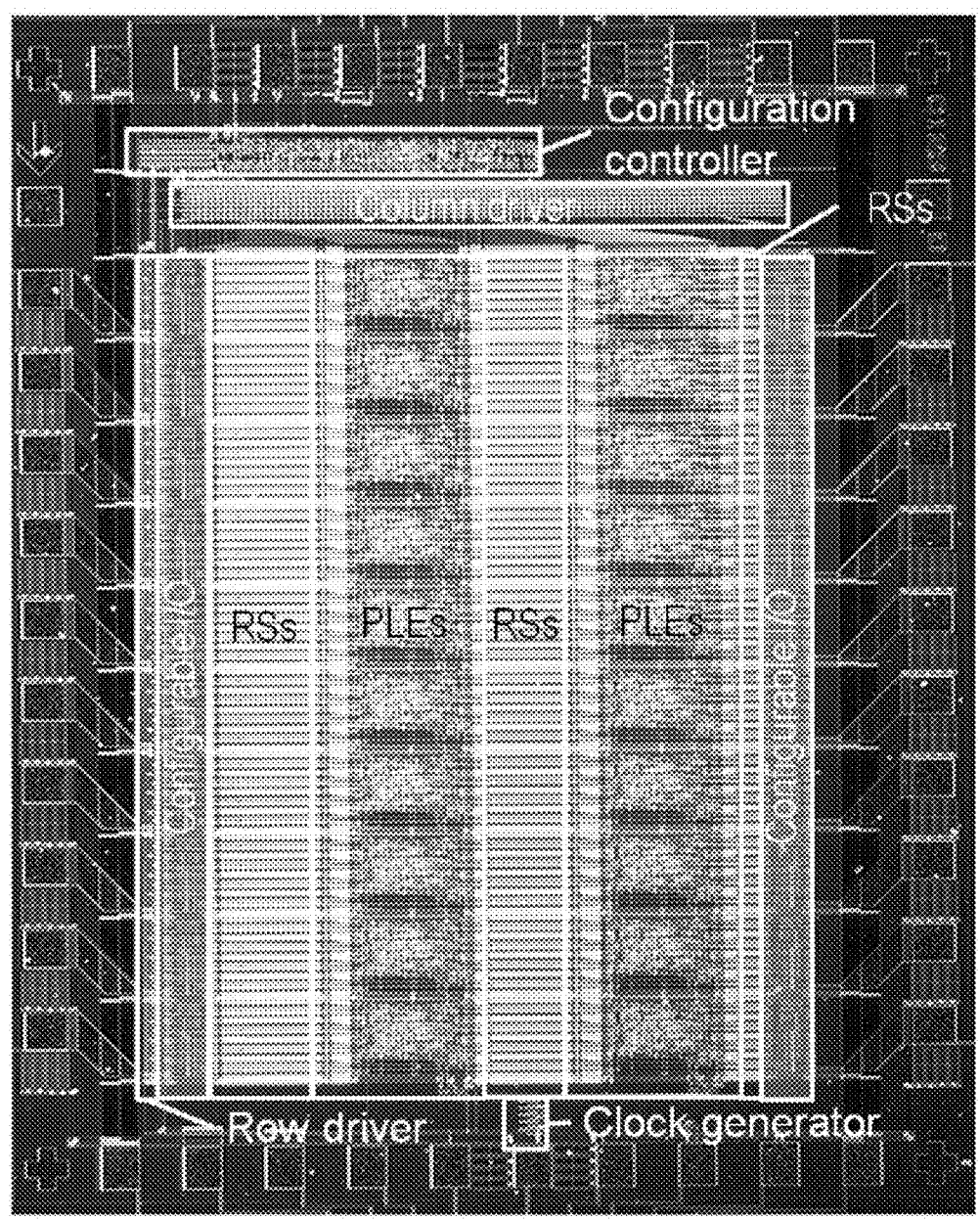
FIG. 20 is a photograph for describing a configuration in Example.
Figure 21:
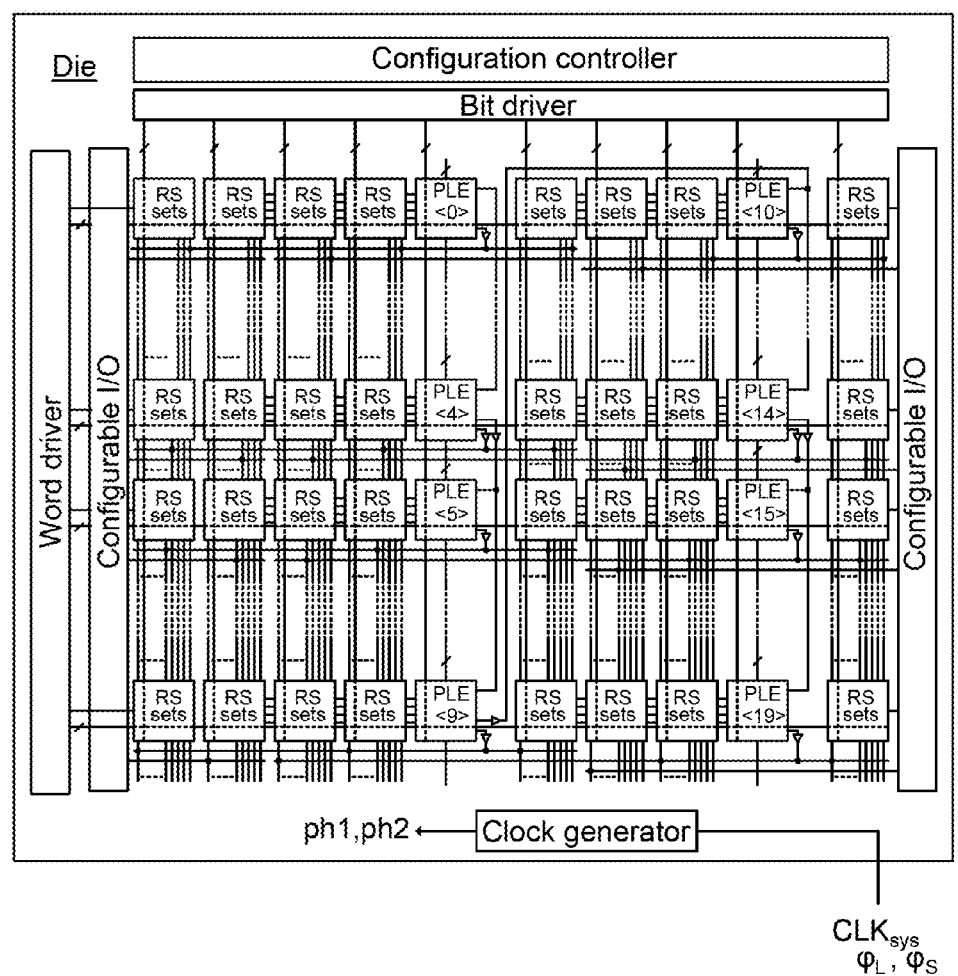
FIG. 21 is a block diagram for describing a configuration in Example.

FIG. 20 is a chip photograph of the FPGA which was actually fabricated. In FIG. 20, the circuits described using FIG. 16 are arranged. The FPGA in FIG. 20 can be represented by a block diagram in FIG. 21. In a die of the FPGA which was actually fabricated, 20 programmable logic elements (PLE<0> to PLE<19>) were arranged.

Figure 22:
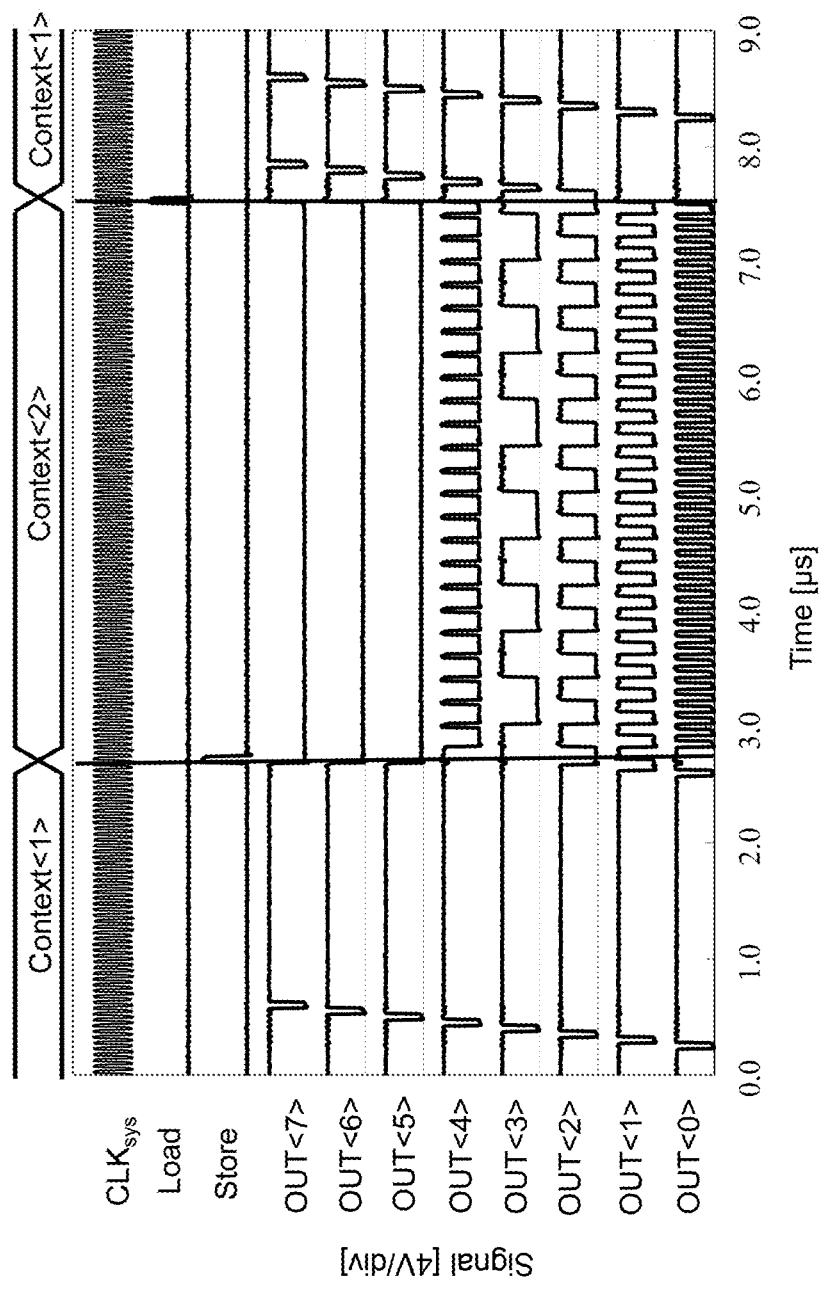
FIG. 22 is a waveform diagram for describing a configuration in Example.

FIG. 22 shows output waveforms in which the function of the FPGA is switched by switching a context. By switching the context, the FPGA functions as a shifter in Context<1> and the FPGA functions as a counter in Context<2>. Favorable waveforms were obtained both in Context<1> and in Context<2>.

Reduction in power consumption of the fabricated FPGA was examined. For comparison, power consumption of the following FPGAs were measured: an FPGA fabricated in the above manner (Type A); an FPGA including a volatile shadow register (Type B); an FPGA without a power gating function (Type C); and an FPGA without a power gating function and a shadow register function (Type D).

Power consumption of the Type A to Type D used for comparison were measured while switching the function as shown in FIG. 22. Context<1> is regarded as Task 1, and Context<2> is regarded as Task 2.

In Type A, PLE<0> to PLE<7> included in the FPGA were utilized to obtain the function of Task 1, and PLE<0> to PLE<4> were utilized to obtain the function of Task 2. In the other PLE<8> to PLE<19>, power supply is stopped by a power gating function.

Figure 23:
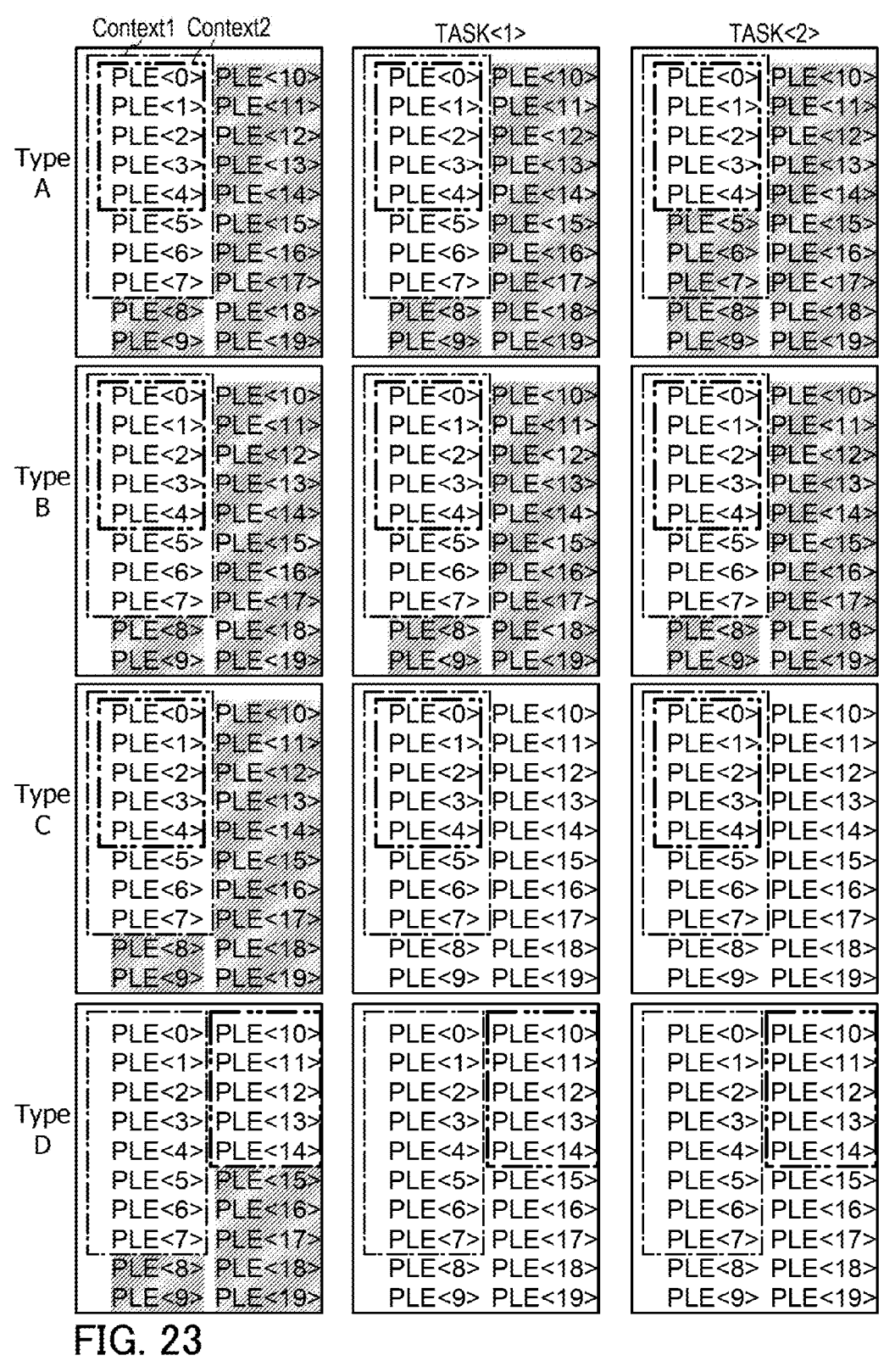

In FIG. 23, states where the functions of the PLE<0> to PLE<19> in Type A to Type D which were described above are visualized. Type A to Type D are shown in the order from the top.

On the left column in FIG. 23, PLEs needed to provide a shifter circuit in Context<1> are surrounded by a dashed-dotted line and PLEs needed to provide a counter circuit in Context<2> are surrounded by a bold dashed double-dotted line. PLEs which are not needed for the operation are hatched in the diagram. In Type D, since a shadow register is not provided, PLE<10> to PLE<14> are used as the PLEs needed to provide the counter circuit in Context<2> which achieves the function of Task 2.

On the middle column in FIG. 23, PLEs in which power gating is performed in Task 1 are hatched. In Type C and Type D, power gating is not performed since they do not have the power gating function.

On the right column in FIG. 23, PLEs in which power gating is performed in Task 2 are hatched. Since data cannot be saved or restored to a volatile register in Type B, power gating cannot be performed in even PLE<5> to PLE<7> which are not used for the operation. In Type C and Type D, power gating is not performed since they do not have the power gating function.

Figure 24:
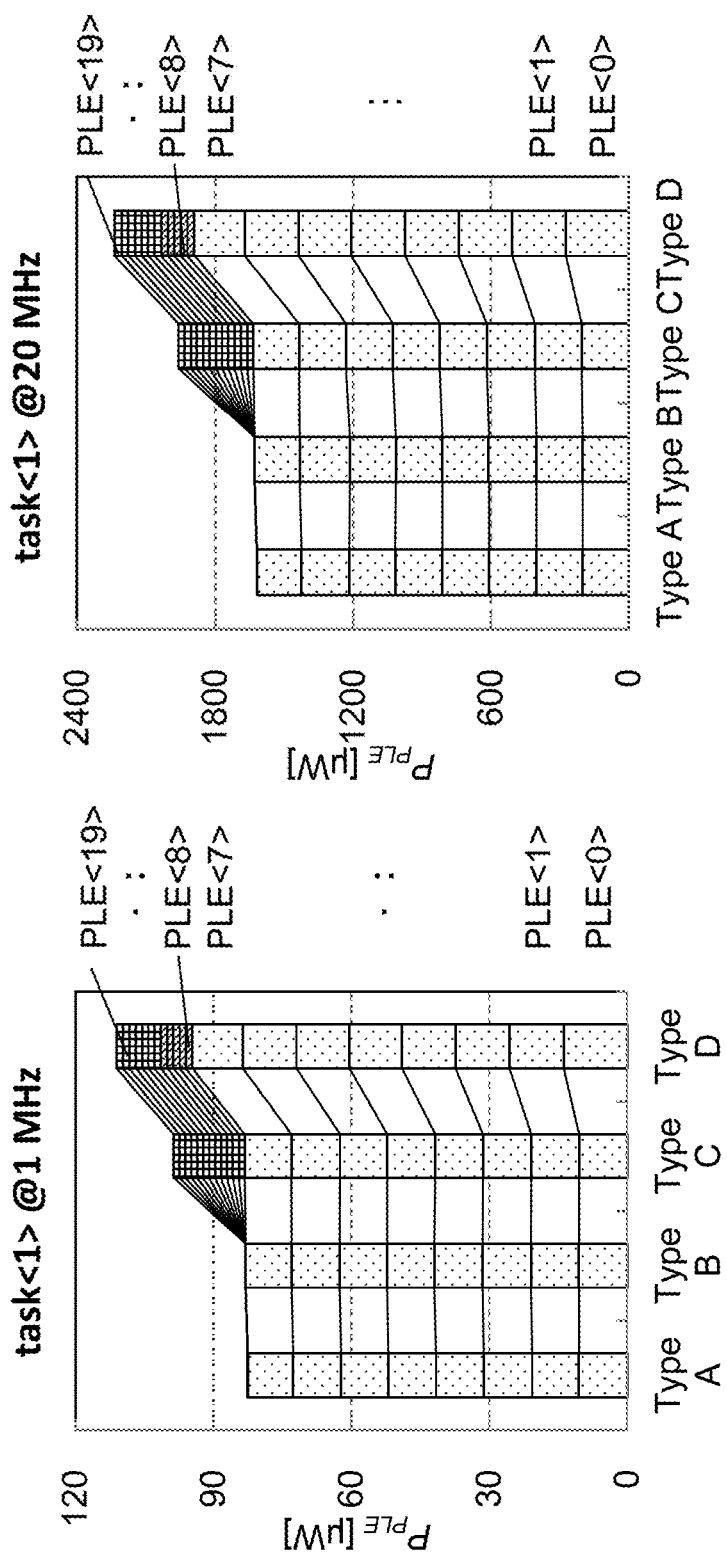
FIG. 24 shows graphs for describing a configuration in Example.

In FIG. 24, the total amounts of power consumed by PLEs of Type A to Type D in Task 1 are compared. In the left graph, the frequency of a clock signal is 1 MHz, and in the right graph, the frequency of a clock signal is 20 MHz. The PLE<0> to PLE<7> used for an arithmetic operation uniformly consume power in Type A to Type D. In contrast, the PLE<8> to PLE<19> which do not contribute to the arithmetic operation rarely consume power in Type A and Type B; however, the PLE<8> to PLE<19> are factors of increasing power consumption in Type C and Type D without the power gating function.

Figure 25:
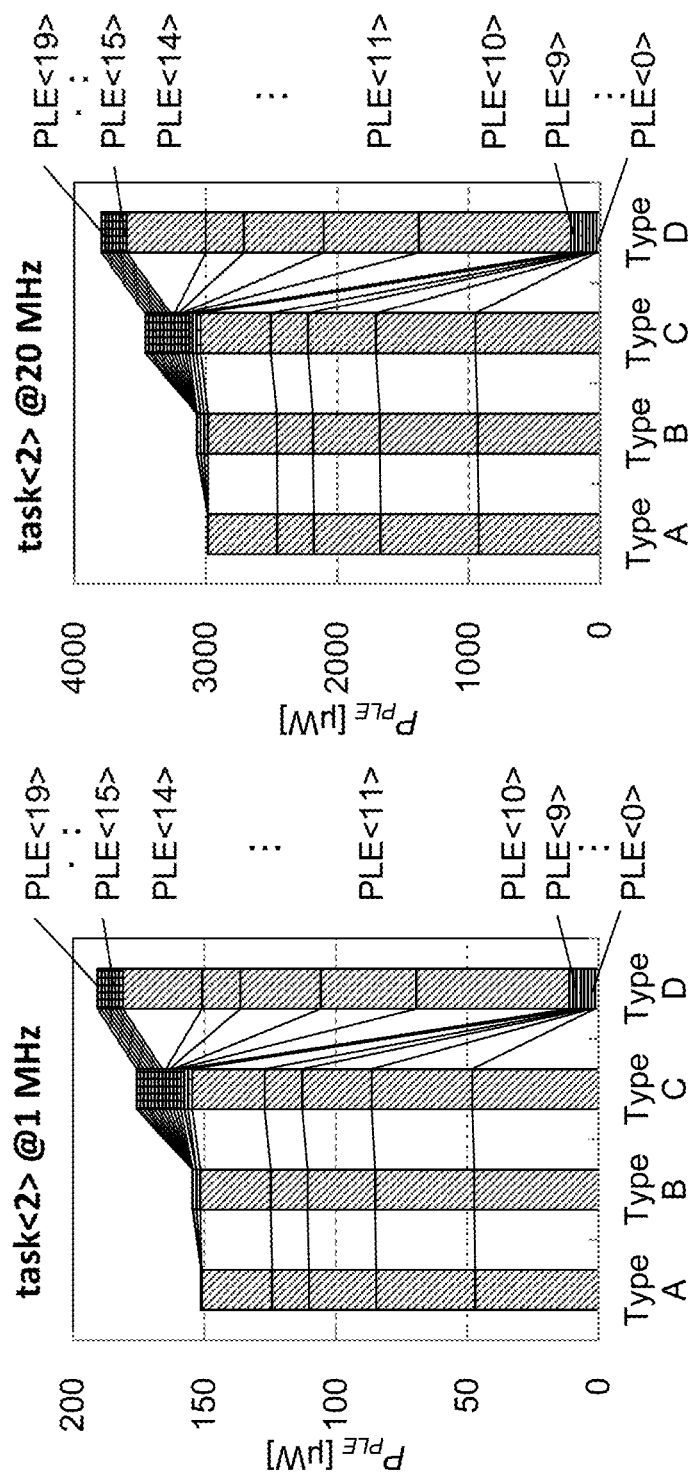
FIG. 25 shows graphs for describing a configuration in Example.

In FIG. 25, the total amounts of power consumed by PLEs of Type A to Type D in Task 2 are compared. In the left graph, the frequency of a clock signal is 1 MHz, and in the right graph, the frequency of a clock signal is 20 MHz. The PLE<0> to PLE<4> used for an arithmetic operation uniformly consume power in Type A to Type D. In contrast, the PLE<8> to PLE<19> which do not contribute to the arithmetic operation rarely consume power in Type A and Type B; however, the PLE<8> to PLE<19> are factors of increasing power consumption in Type C and Type D without the power gating function. Furthermore, since data cannot be saved or restored and power gating cannot be performed in Type B, the amount of consumed power is increased compared with Type A by the amount of power consumed in PLE<5> to PLE<7>.

The above results show that by providing a nonvolatile shadow register described as an application example of a semiconductor device including a two-phase clock, a multi-context FPGA capable of power gating of PLEs consumes relatively low power.

This application is based on Japanese Patent Application serial no. 2014-010993 filed with Japan Patent Office on Jan. 24, 2014 and Japanese Patent Application serial no. 2014-179884 filed with Japan Patent Office on Sep. 4, 2014, the entire contents of which are hereby incorporated by reference.

What is claimed is:

1. A semiconductor device comprising:
a first circuit; and
a second circuit,
wherein the first circuit includes a third circuit and a fourth circuit,
wherein the third circuit includes a fifth circuit which is configured to receive data and hold the data,
wherein the fourth circuit includes a nonvolatile memory portion,
wherein the second circuit is configured to output a third signal to the fifth circuit on the basis of a clock signal, a first signal, and a second signal,
wherein the third signal is configured to control operation of the fifth circuit so that the fifth circuit receives data or holds the data,
wherein the fourth circuit is configured to save the data of the fifth circuit on the basis of the first signal in a first period and to restore the data to the fifth circuit on the basis of the second signal in a second period, and
wherein the third signal is fixed at the same logic level by which the fifth circuit holds the data in the first period and the second period.

2. The semiconductor device according to claim 1,
wherein the third circuit includes a sixth circuit which is configured to receive and hold the data of the fifth circuit,
wherein the second circuit is configured to output a fourth signal to the sixth circuit on the basis of the clock signal, the first signal, and the second signal,
wherein the fourth signal is configured to control operation of the sixth circuit so that the sixth circuit receives the data or holds the data, and
wherein the fourth signal is fixed at the same logic level by which the sixth circuit holds the data in the first period and the second period.

3. The semiconductor device according to claim 2,
wherein the second circuit includes a first combination circuit, a second combination circuit, a third combination circuit, and a fourth combination circuit,
wherein the first combination circuit is a NAND circuit and configured to output a sixth signal on the basis of the clock signal and a fifth signal,
wherein the fifth signal is a signal which is obtained by inverting and delaying the clock signal,
wherein the second combination circuit is a NAND circuit and configured to output a ninth signal on the basis of a seventh signal and an eighth signal,
wherein the seventh signal is a signal which is obtained by inverting the clock signal,
wherein the eighth signal is a signal which is obtained by delaying the clock signal,
wherein the third combination circuit is a NOR circuit and configured to output the fourth signal on the basis of the first signal, the second signal, and the sixth signal, and
wherein the fourth combination circuit is a NOR circuit and configured to output the third signal on the basis of the first signal, the second signal, and the ninth signal.

4. The semiconductor device according to claim 2,
wherein the second circuit includes a first combination circuit, a second combination circuit, a third combination circuit, and a fourth combination circuit,
wherein the first combination circuit is a NOR circuit and configured to output a fifth signal on the basis of the first signal and the second signal,
wherein the second combination circuit is a NAND circuit and configured to output a sixth signal on the basis of inverted clock signal and the fifth signal,
wherein the third combination circuit is an AND circuit and configured to output the fourth signal on the basis of a seventh signal and an eighth signal,
wherein the seventh signal is a signal which is obtained by delaying the sixth signal,
wherein the eighth signal is a signal which is obtained by inverting the sixth signal,
wherein the fourth combination circuit is an AND circuit and configured to output the third signal on the basis of the sixth signal and a ninth signal, and
wherein the ninth signal is a signal obtained by inverting the seventh signal.

5. The semiconductor device according to claim 2,
wherein the second circuit includes a first combination circuit, a second combination circuit, a third combination circuit, a fourth combination circuit, a fifth combination circuit, and a sequential circuit,
wherein the first combination circuit is a NAND circuit and configured to output a sixth signal on the basis of the clock signal and a fifth signal,
wherein the fifth signal is a signal which is obtained by inverting and delaying the clock signal,
wherein the second combination circuit is a NAND circuit and configured to output a ninth signal on the basis of a seventh signal and an eighth signal,
wherein the seventh signal is a signal which is obtained by inverting the clock signal,
wherein the eighth signal is a signal which is obtained by delaying the clock signal,
wherein the third combination circuit is a OR circuit and configured to output a tenth signal on the basis of the first signal and the second signal,
wherein the sequential circuit is a flipflop circuit and configured to output an eleventh signal on the basis of the ninth signal and the tenth signal,
wherein the fourth combination circuit is a NOR circuit and configured to output the fourth signal on the basis of the sixth signal and the eleventh signal, and wherein the fifth combination circuit is a NOR circuit and configured to output the third signal on the basis of the ninth signal and the eleventh signal.

6. The semiconductor device according to claim 1,
wherein the nonvolatile memory portion includes first to third transistors,
wherein one of a source and a drain of the first transistor is electrically connected to the fifth circuit,
wherein a gate of the second transistor is electrically connected to the other of the source and the drain of the first transistor,
wherein one of a source and a drain of the second transistor is electrically connected to a wiring which supplies a constant potential,
wherein one of a source and a drain of the third transistor is electrically connected to the other of the source and the drain of the second transistor,
wherein the other of the source and the drain of the third transistor is electrically connected to the fifth circuit,
wherein the first signal is supplied to a gate of the first transistor,
wherein the second signal is supplied to a gate of the third transistor, and
wherein a semiconductor layer of the first transistor includes an oxide semiconductor.

7. An electronic device comprising:
the semiconductor device according to claim 1; and
a display device.

8. The semiconductor device according to claim 1,
wherein the fifth circuit includes a first inverter loop electrically connected to a data terminal through a first analog switch, and
wherein the first analog switch is configured to be turned off on the basis of the third signal in the first period and the second period.

9. The semiconductor device according to claim 8,
wherein the third circuit includes a sixth circuit which includes a second inverter loop electrically connected to the fifth circuit through a second analog switch,
wherein the second circuit is configured to output a fourth signal to the sixth circuit on the basis of the clock signal, the first signal, and the second signal,
wherein the second analog switch is turned off on the basis of the fourth signal in the first period and the second period.

10. The semiconductor device according to claim 8;
wherein on/off state of an inverting circuit in the first inverter loop is controlled by the third signal.

11. The semiconductor device according to claim 9;
wherein on/off state of an inverting circuit in the second inverter loop is controlled by the fourth signal.

12. A semiconductor device comprising:
a first circuit; and
a second circuit,
wherein the first circuit includes a third circuit and a fourth circuit,
wherein the third circuit includes a fifth circuit which is configured to receive data and hold the data,
wherein the second circuit is configured to output a third signal to the fifth circuit on the basis of a clock signal, a first signal, and a second signal,
wherein the third signal is configured to control operation of the fifth circuit so that the fifth circuit receives data or holds the data,
wherein the fourth circuit is configured to save the data of the fifth circuit on the basis of the first signal in a first period and to restore the data to the fifth circuit on the basis of the second signal in a second period, and
wherein the third signal is fixed at the same logic level by which the fifth circuit holds the data in the first period and the second period.

13. The semiconductor device according to claim 12,
wherein the fourth circuit includes first to third transistors,
wherein one of a source and a drain of the first transistor is electrically connected to the fifth circuit,
wherein a gate of the second transistor is electrically connected to the other of the source and the drain of the first transistor,
wherein one of a source and a drain of the second transistor is electrically connected to a wiring which supplies a constant potential,
wherein one of a source and a drain of the third transistor is electrically connected to the other of the source and the drain of the second transistor,
wherein the other of the source and the drain of the third transistor is electrically connected to the fifth circuit,
wherein the first signal is supplied to a gate of the first transistor,
wherein the second signal is supplied to a gate of the third transistor, and
wherein a semiconductor layer of the first transistor includes an oxide semiconductor.

* * * * *